(12) United States Patent
Schwarz et al.

(10) Patent No.: US 11,251,081 B2
(45) Date of Patent: Feb. 15, 2022

(54) METHOD FOR PRODUCING A PLURALITY OF SEMICONDUCTOR CHIPS AND SEMICONDUCTOR CHIP

(71) Applicant: OSRAM OLED GmbH, Regensburg (DE)

(72) Inventors: Thomas Schwarz, Regensburg (DE); Lutz Höppel, Alteglofsheim (DE); Thorsten Frank Baumheinrich, Altdorf (DE); Jens Richter, Hemau (DE)

(73) Assignee: OSRAM OLED GMBH, Regensburg (DE)

( * ) Notice: Subject to any disclaimer, the term of this patent is extended or adjusted under 35 U.S.C. 154(b) by 39 days.

(21) Appl. No.: 16/758,659

(22) PCT Filed: Oct. 25, 2018

(86) PCT No.: PCT/EP2018/079335
§ 371 (c)(1),
(2) Date: Apr. 23, 2020

(87) PCT Pub. No.: WO2019/081668
PCT Pub. Date: May 2, 2019

(65) Prior Publication Data
US 2020/0350207 A1 Nov. 5, 2020

(30) Foreign Application Priority Data

Oct. 27, 2017 (DE) ..................... 10 2017 125 276.2

(51) Int. Cl.
*H01L 21/78* (2006.01)
*H01L 25/16* (2006.01)
(52) U.S. Cl.
CPC ............ *H01L 21/78* (2013.01); *H01L 25/167* (2013.01)

(58) Field of Classification Search
CPC ......... H01L 21/78; H01L 25/16; H01L 25/00; H01L 25/167; H01L 25/50; H01L 21/7806
See application file for complete search history.

(56) References Cited

U.S. PATENT DOCUMENTS 6,300,224 B1    10/2001   Arima et al.
2004/0009649 A1  1/2004   Kub et al.
(Continued)

FOREIGN PATENT DOCUMENTS

DE    102015116855 A1    4/2017
DE    102017123290 A1    4/2019
(Continued)

OTHER PUBLICATIONS

International Search Report and Written Opinion in corresponding International Application No. PCT/EP2018/079335 dated Dec. 10, 2018, 14 pages.
(Continued)

*Primary Examiner* — Thanh T Nguyen
(74) *Attorney, Agent, or Firm* — MH2 Technology Law Group LLP

(57) ABSTRACT

The method of manufacturing a plurality of semiconductor chips (100) comprises a step A) of providing a semiconductor substrate (1) having a plurality of integrated electronic circuits (2) on a top side (10) thereof. In a step B), a sacrificial layer (3) is applied on one side of the semiconductor substrate. In a step C), holes (30) are introduced in the sacrificial layer so that at least one hole is formed above each electronic circuit. In a step D), the semiconductor substrate is adhered to a carrier (5) with the sacrificial layer at the front, an adhesive layer (4) being used between the sacrificial layer and the carrier, and the adhesive layer filling the holes so that holding elements (40) from the adhesive layer are formed in the holes. In a step E) the semiconductor
(Continued)

Figure 2B:
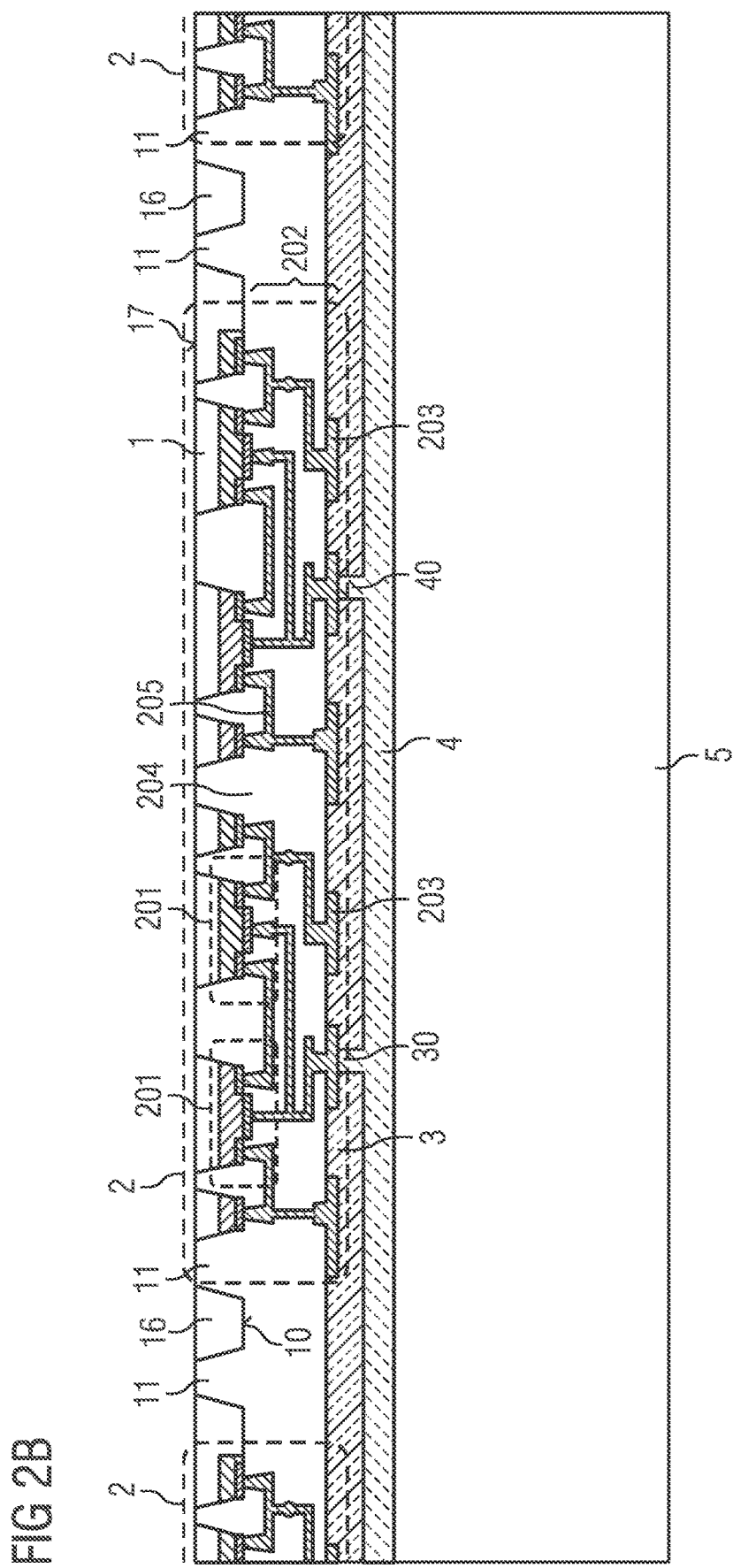

substrate is thinned. In a step F) separation trenches (6) are introduced between the electronic circuits, which extend from a side of the electronic circuits facing away from the carrier to the sacrificial layer and penetrate the thinned semiconductor substrate. In a step G) the sacrificial layer is removed in the region between the electronic circuits and the carrier.

17 Claims, 28 Drawing Sheets

(56) References Cited

U.S. PATENT DOCUMENTS

| | | | |
|---|---|---|---|
| 2007/0284602 A1 | 12/2007 | Chitnis et al. | |
| 2012/0286429 A1 | 11/2012 | Han et al. | |
| 2013/0181302 A1* | 7/2013 | Giroud | B81C 1/00015 |
| | | | 257/415 |
| 2014/0087541 A1 | 3/2014 | Werner et al. | |
| 2014/0196850 A1 | 7/2014 | Schuegraf et al. | |
| 2015/0021624 A1 | 1/2015 | Meyer et al. | |
| 2016/0240516 A1 | 8/2016 | Chang | |
| 2016/0318753 A1* | 11/2016 | Chou | B81B 3/001 |
| 2017/0133356 A1 | 5/2017 | Mercier et al. | |
| 2017/0250167 A1 | 8/2017 | Bower et al. | |
| 2017/0294417 A1* | 10/2017 | Edmond | H01L 33/60 |
| 2019/0115274 A1* | 4/2019 | Hu | H01L 23/3192 |

FOREIGN PATENT DOCUMENTS

| | | |
|---|---|---|
| WO | 17089676 A1 | 6/2017 |
| WO | 19068523 A1 | 4/2019 |
| WO | 2019091948 A1 | 5/2019 |

OTHER PUBLICATIONS

Anonymous,"X-Celeprint AMiLED Demonstrator", X-Celeprint Ltd, 2013, 5 pages.

* cited by examiner

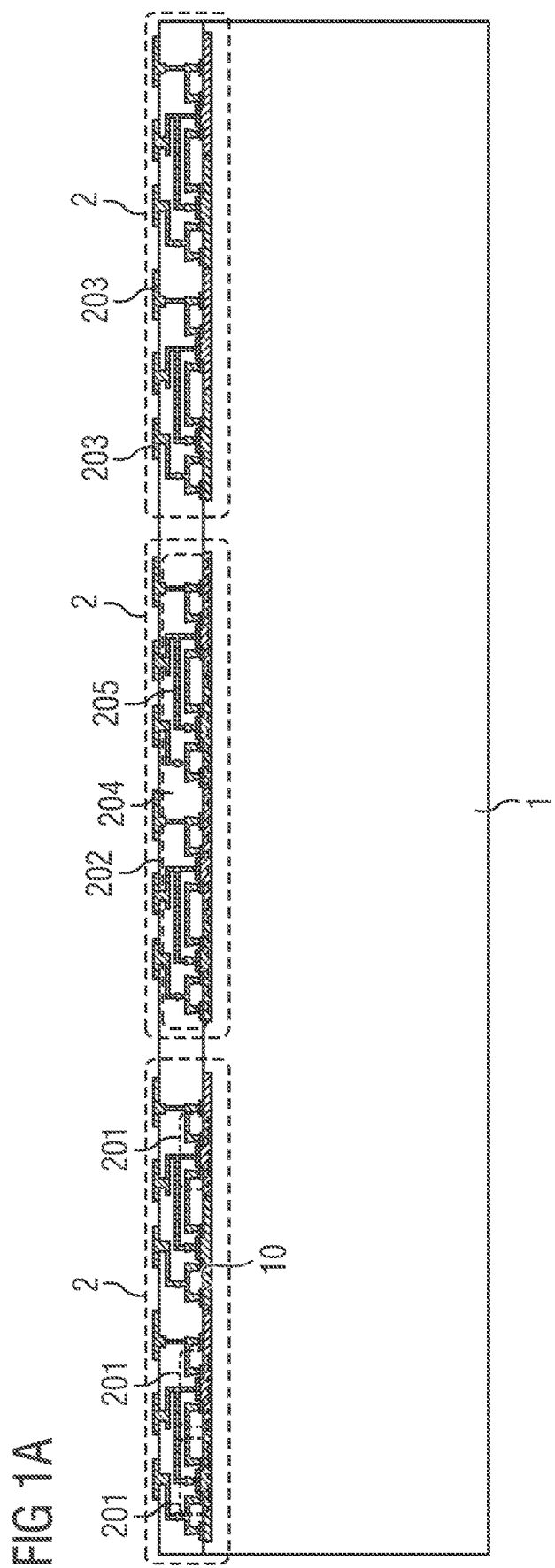

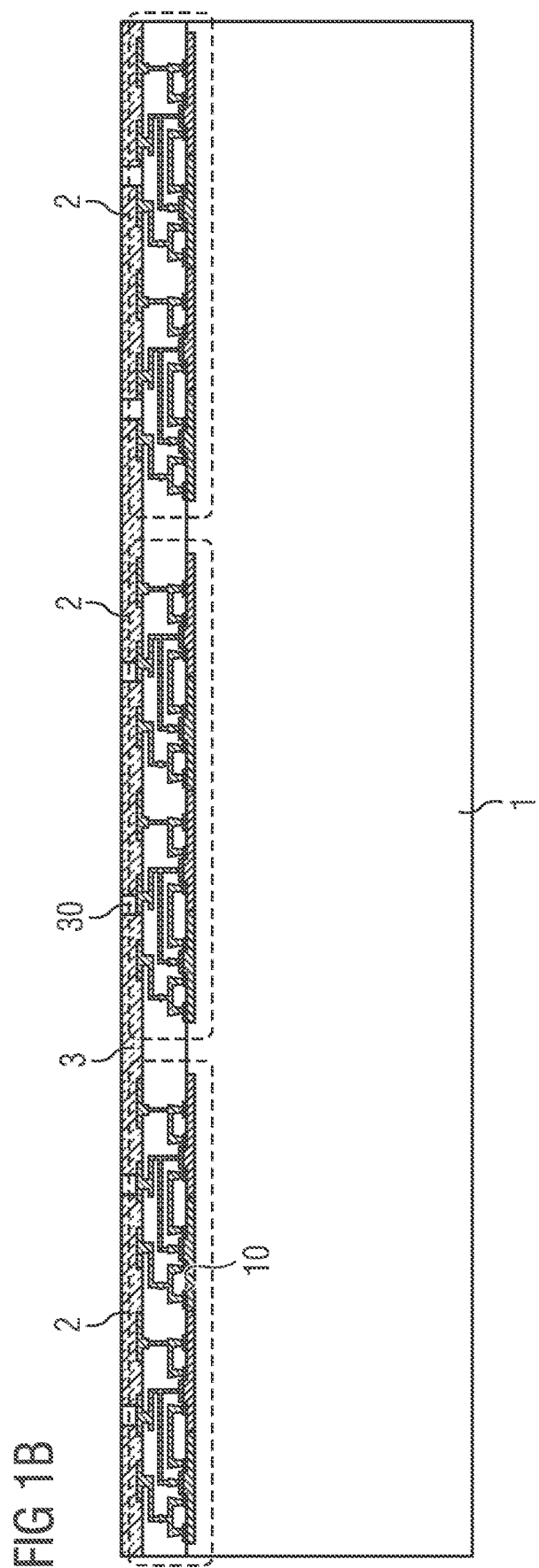

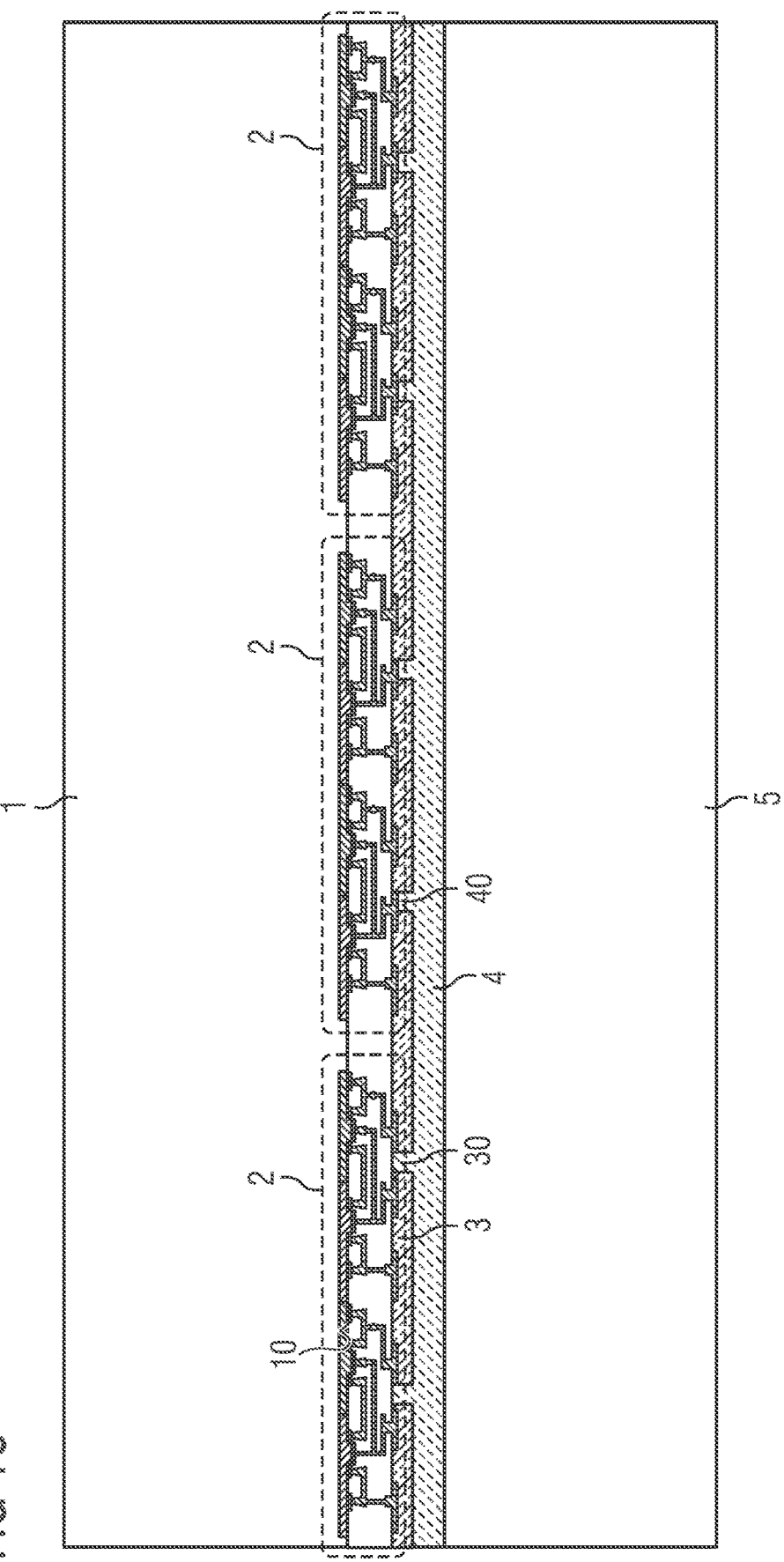

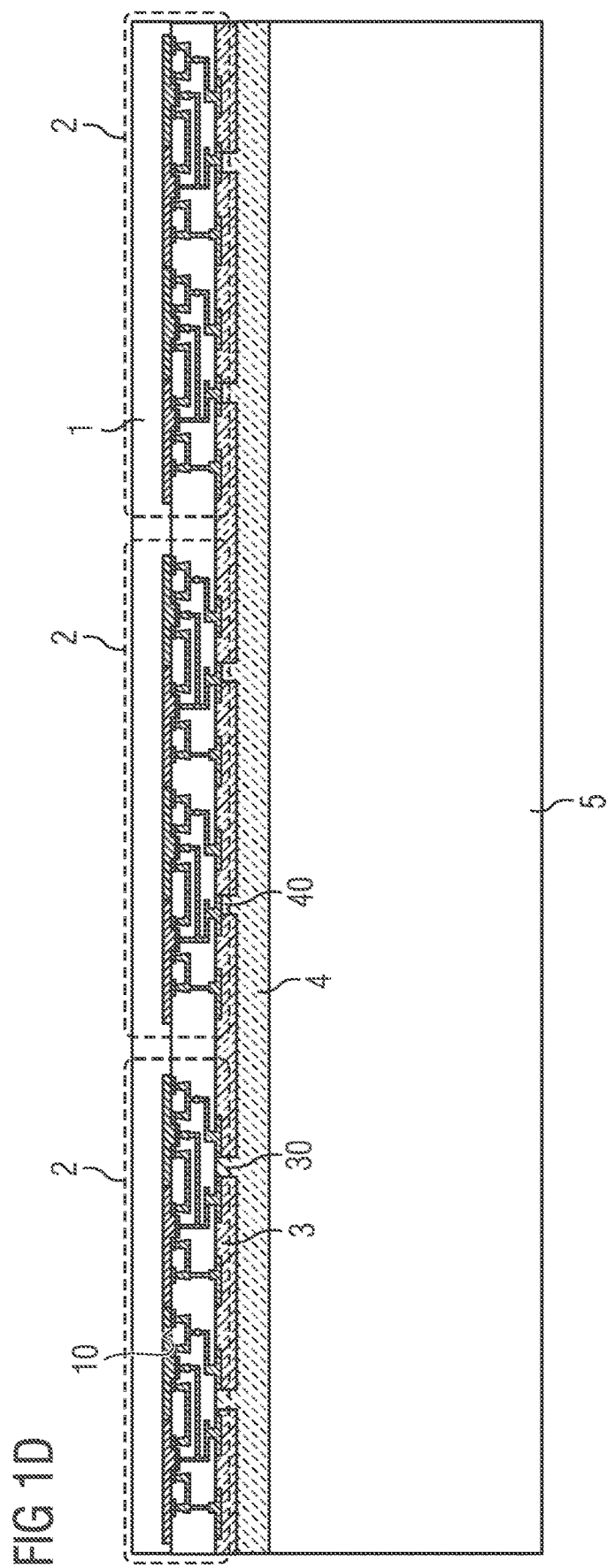

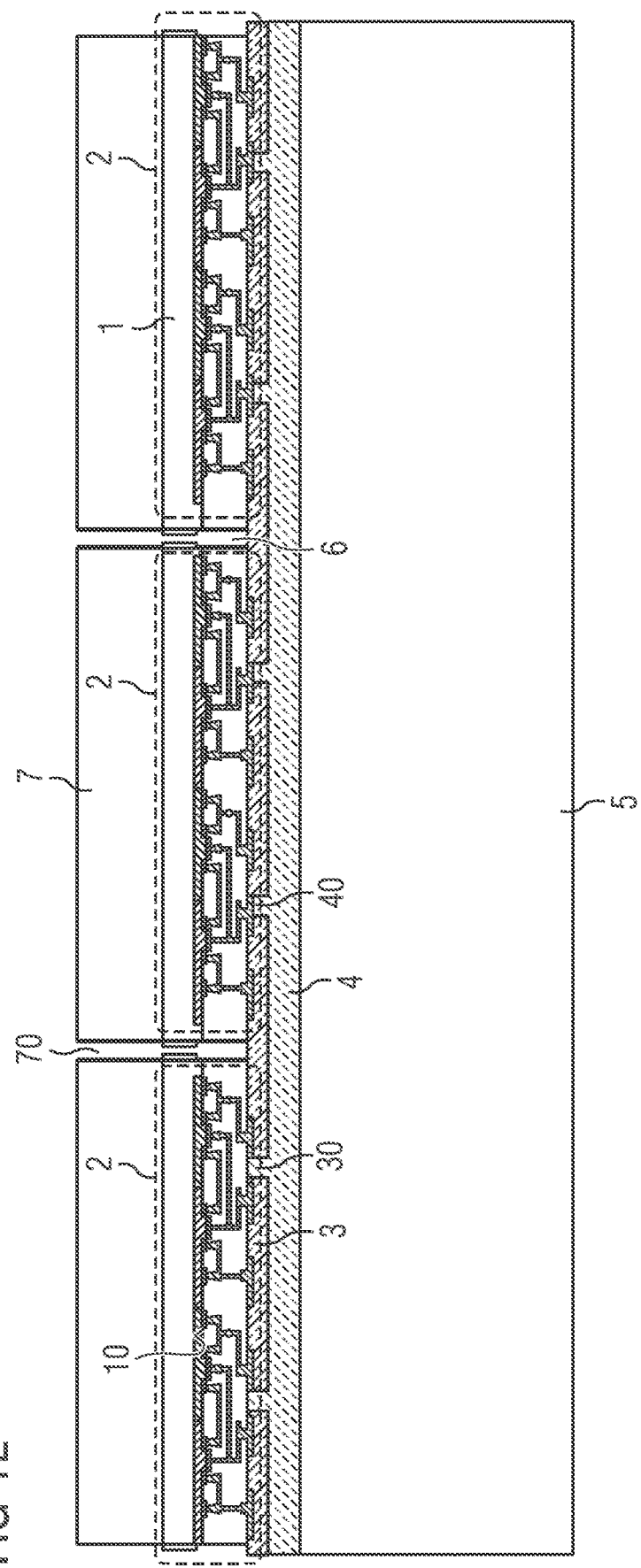

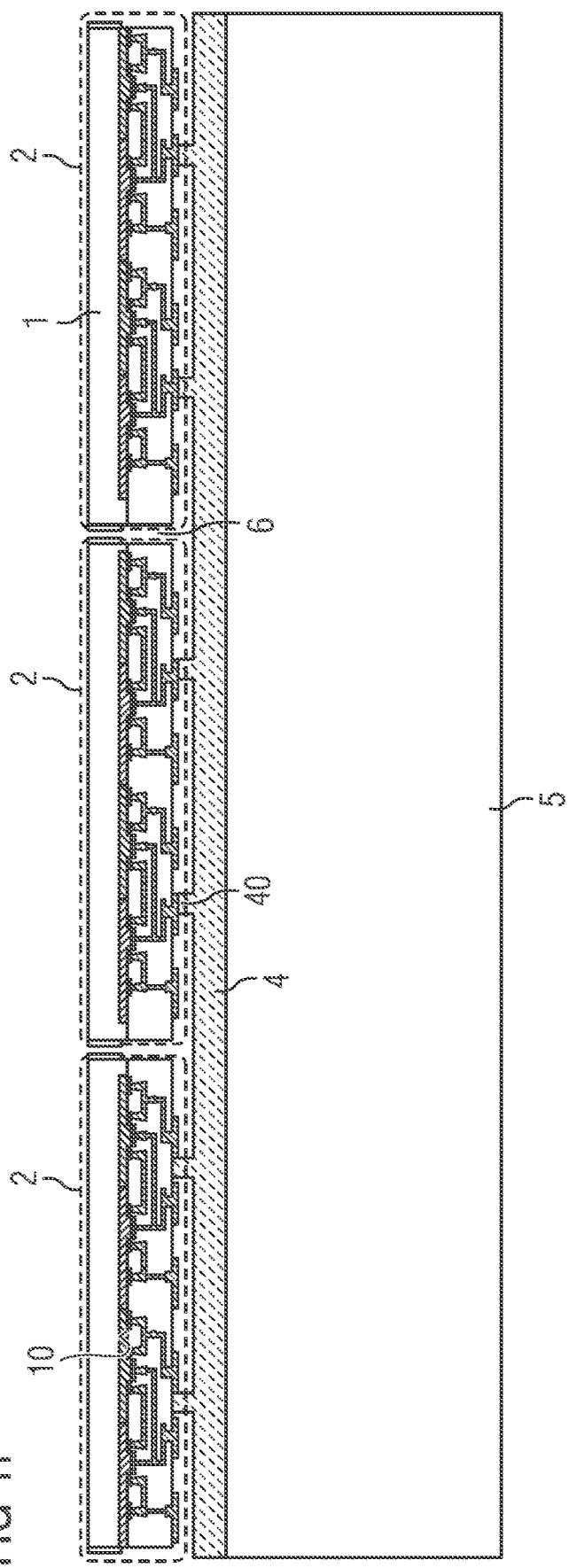
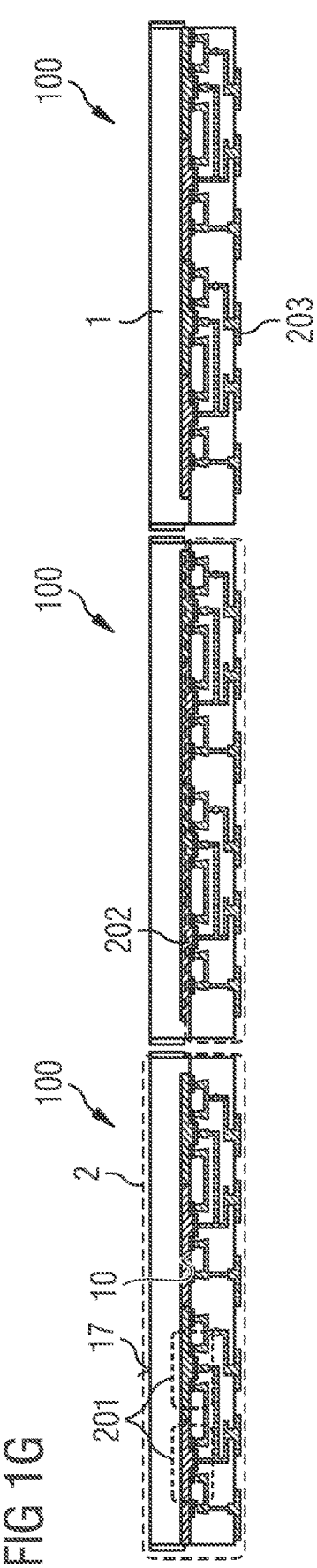
FIG 1F
FIG 1G

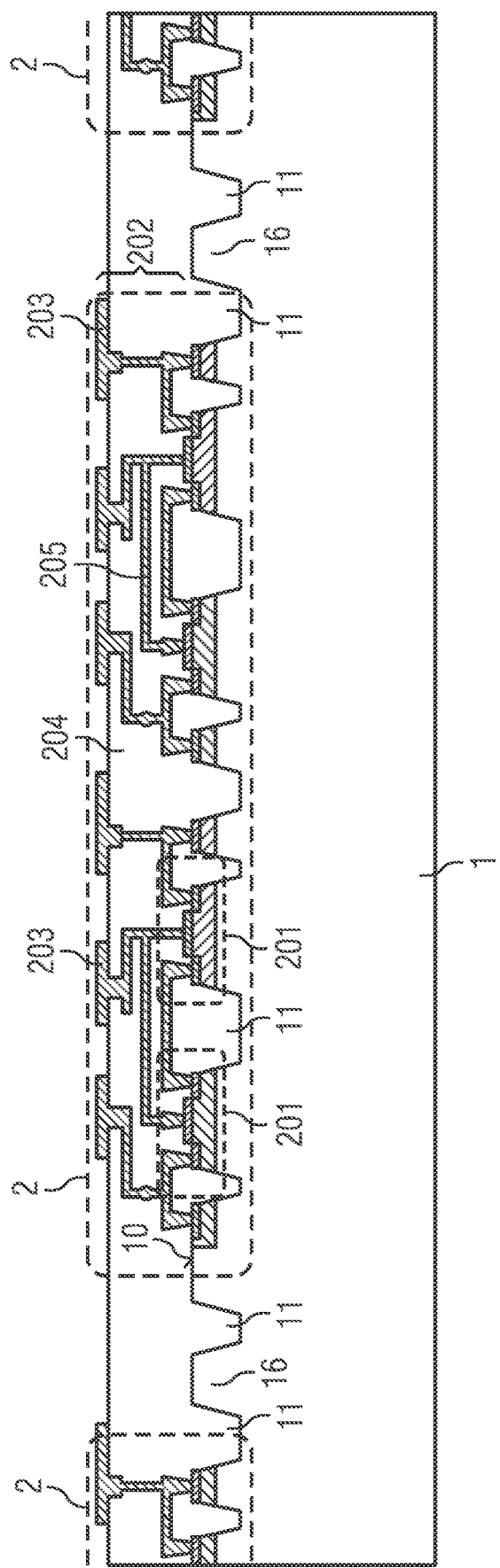

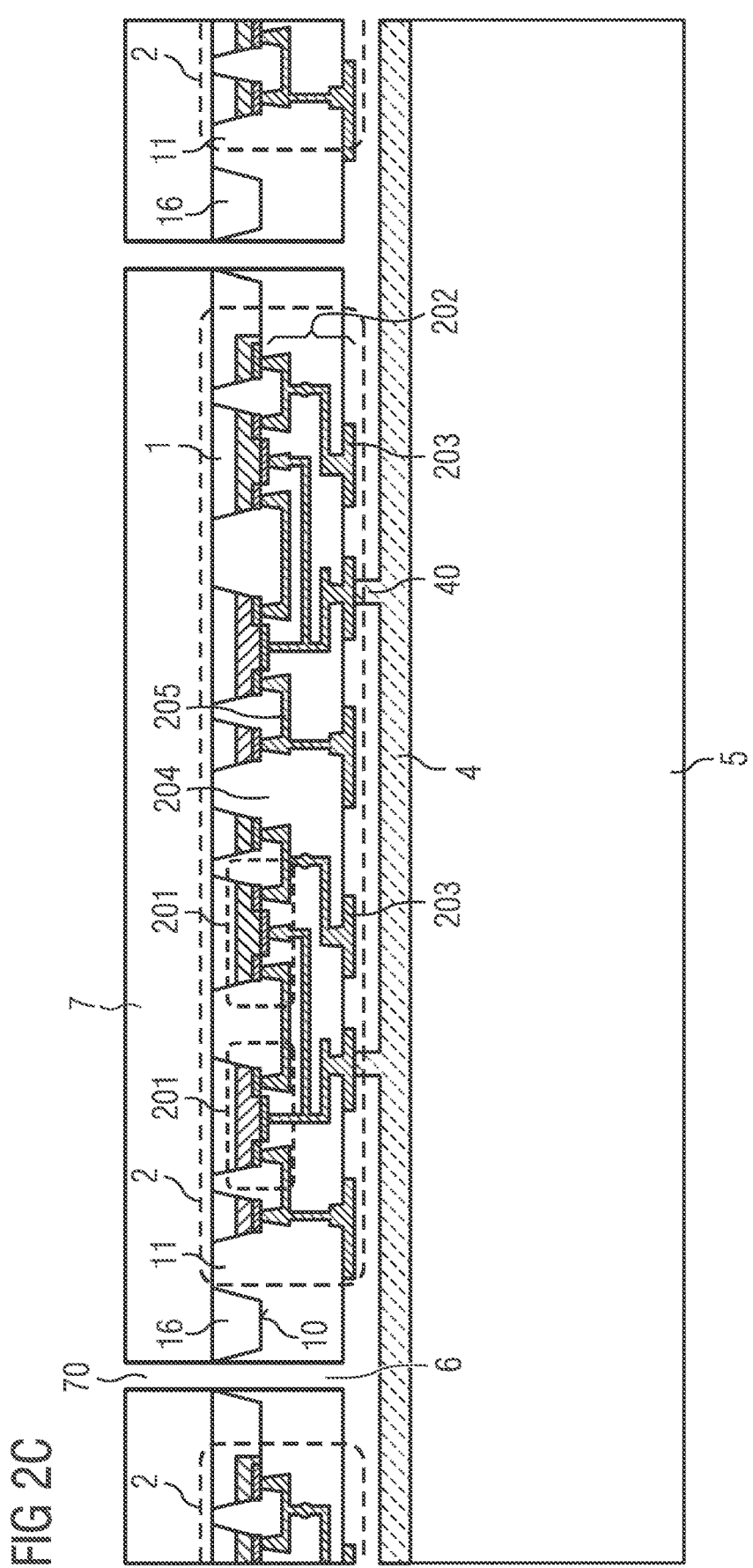

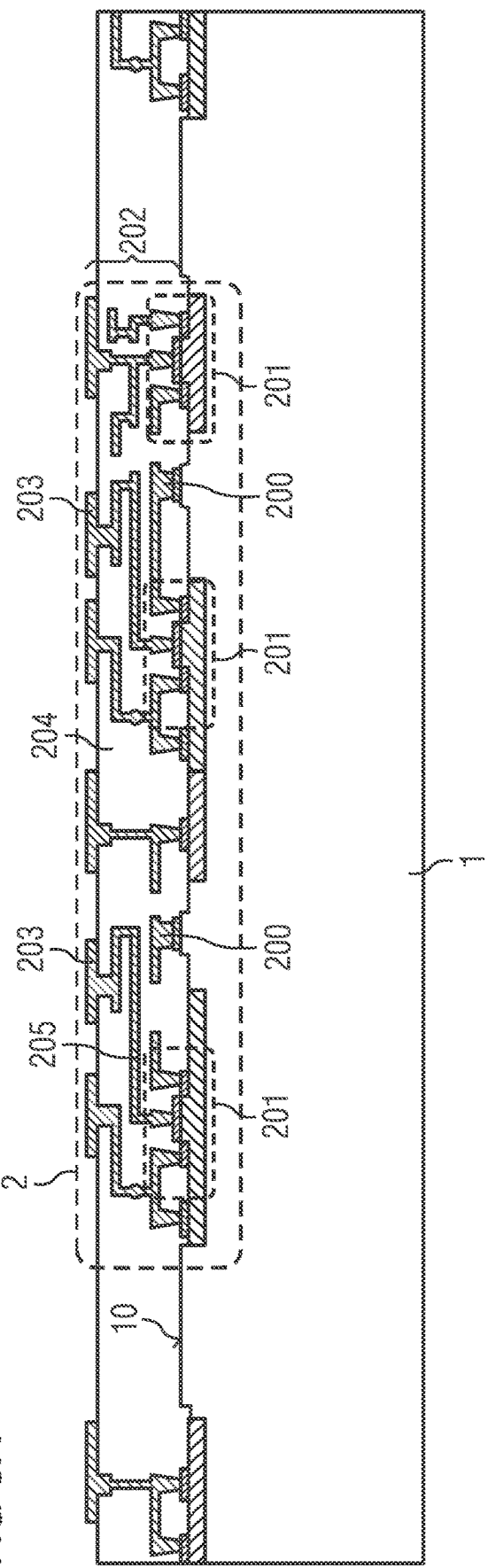

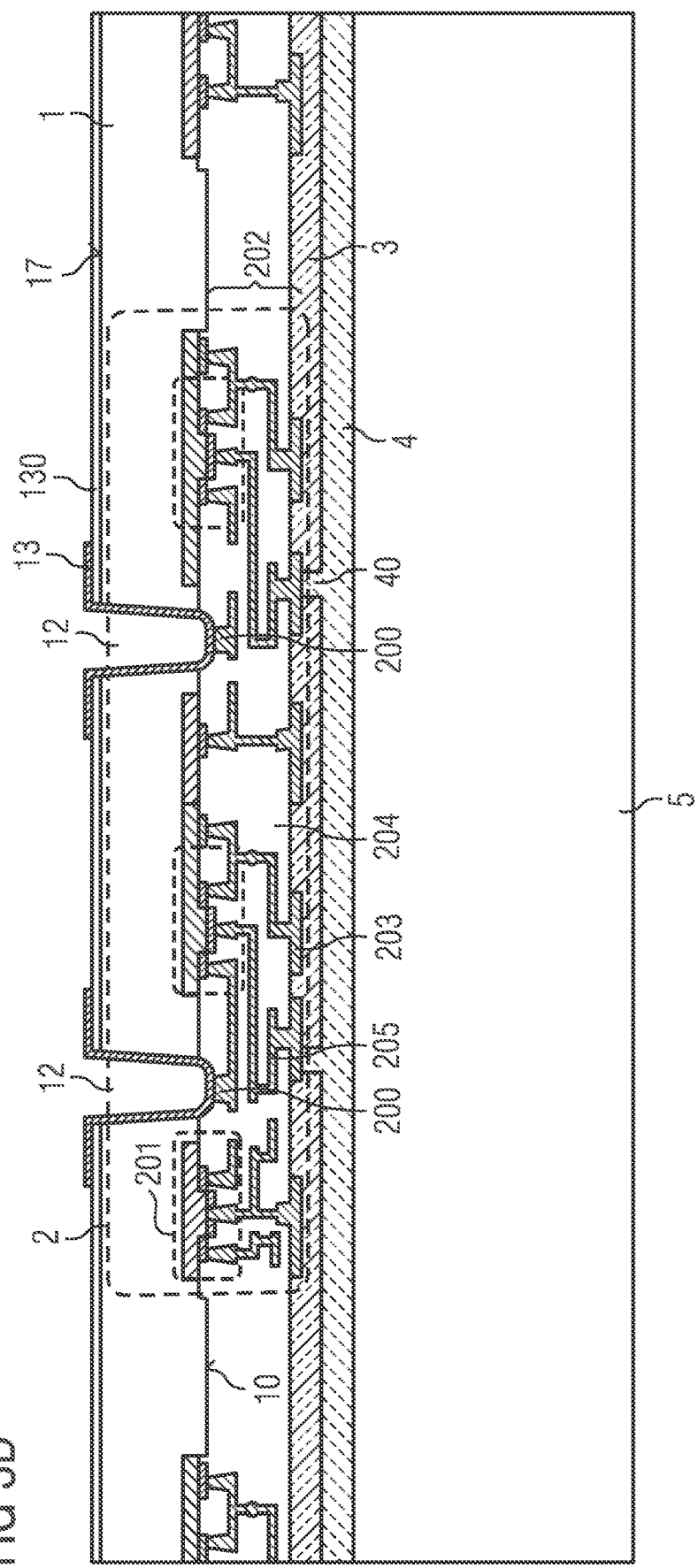

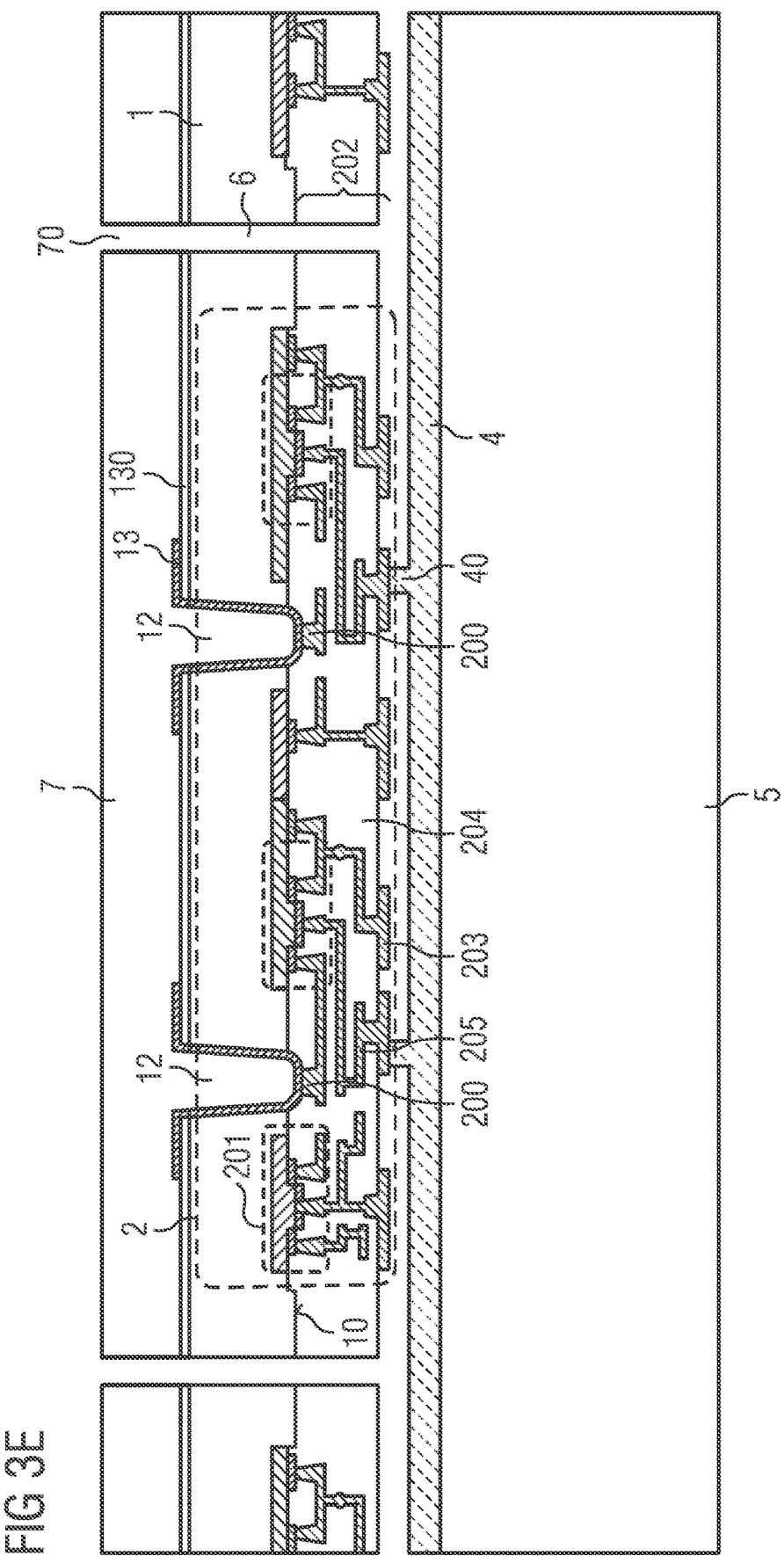

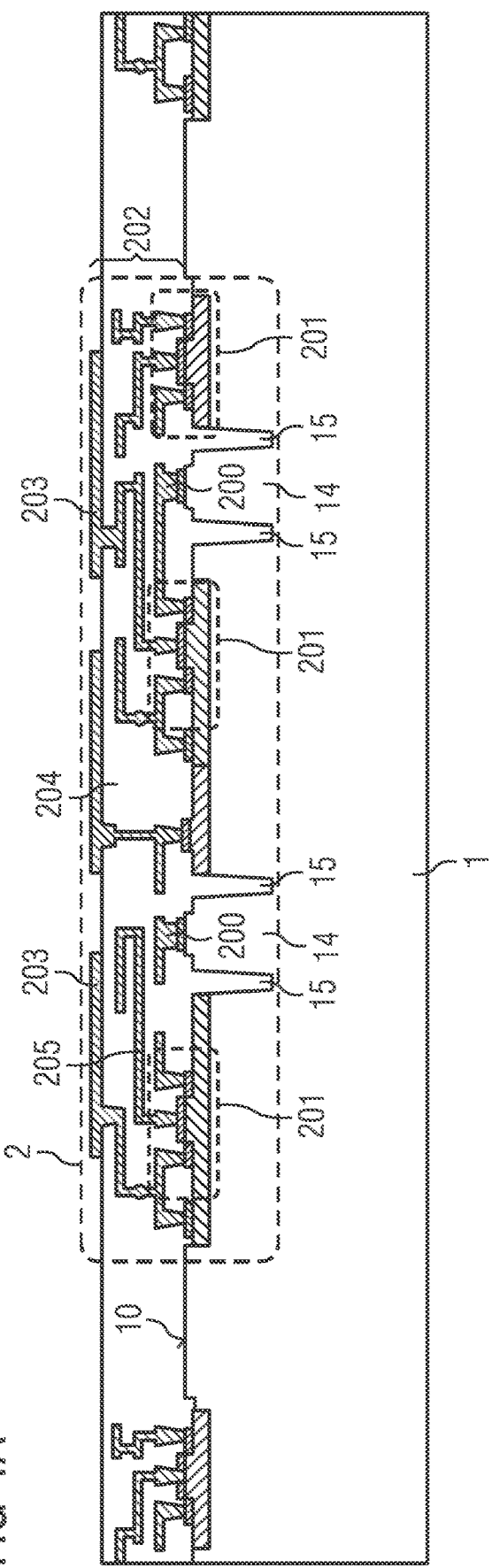

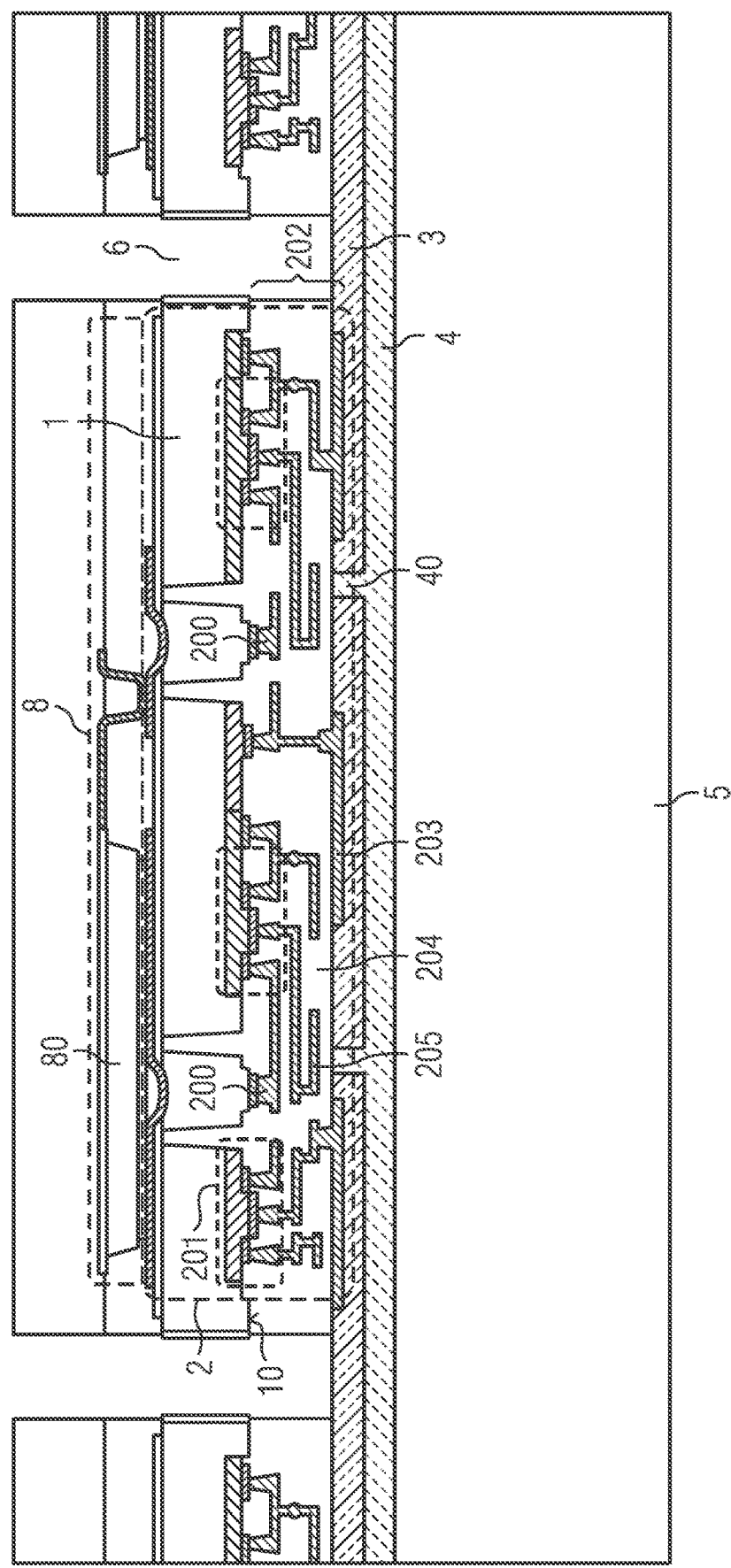

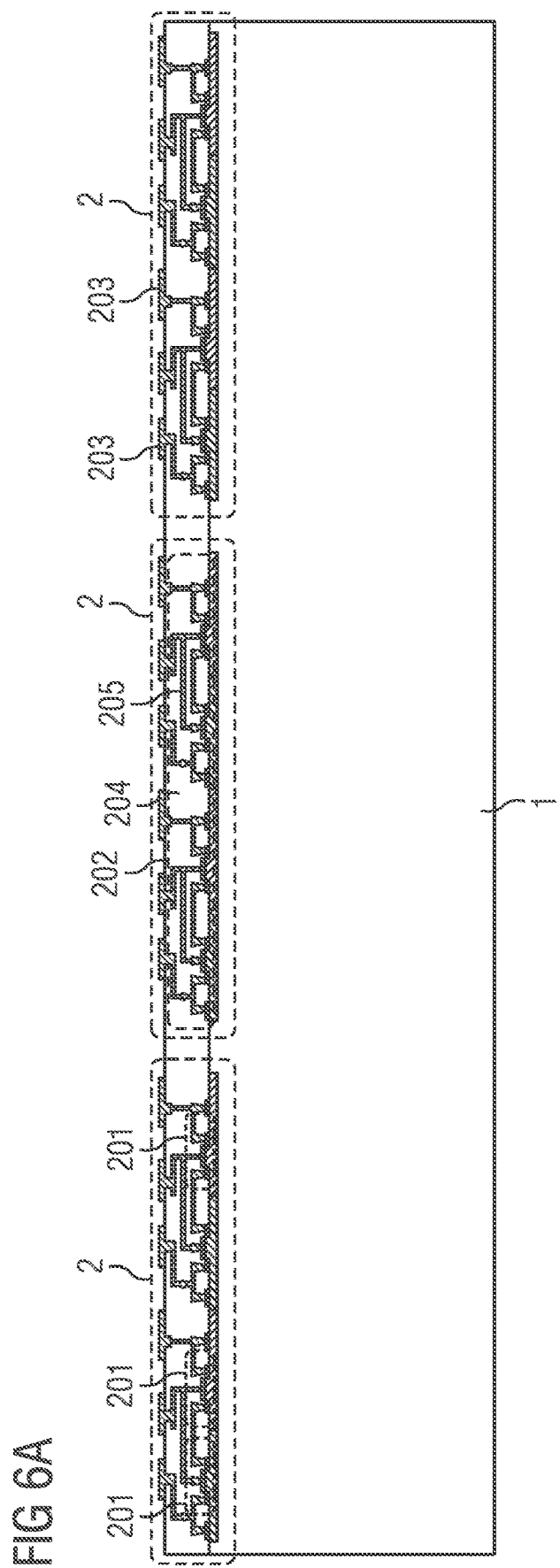

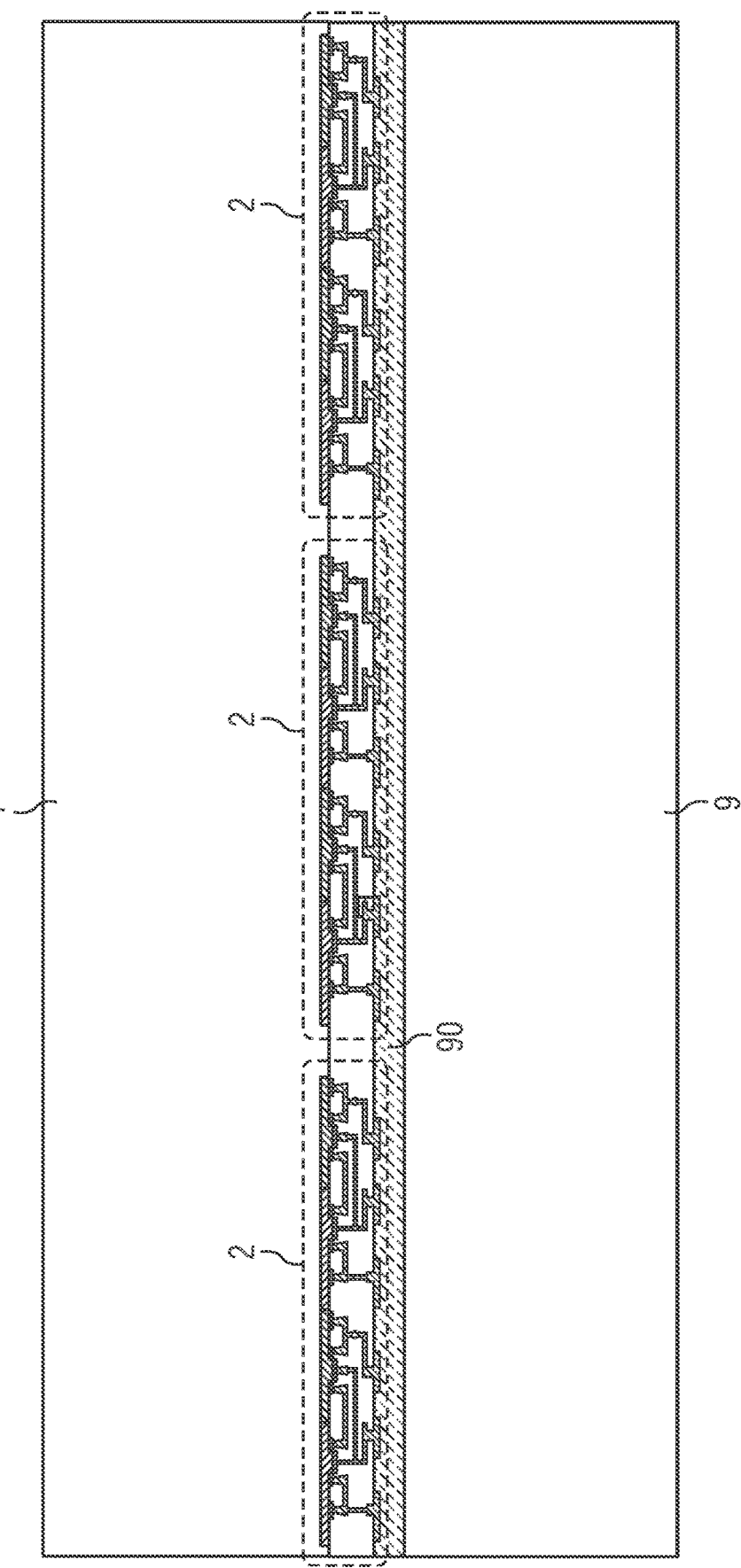

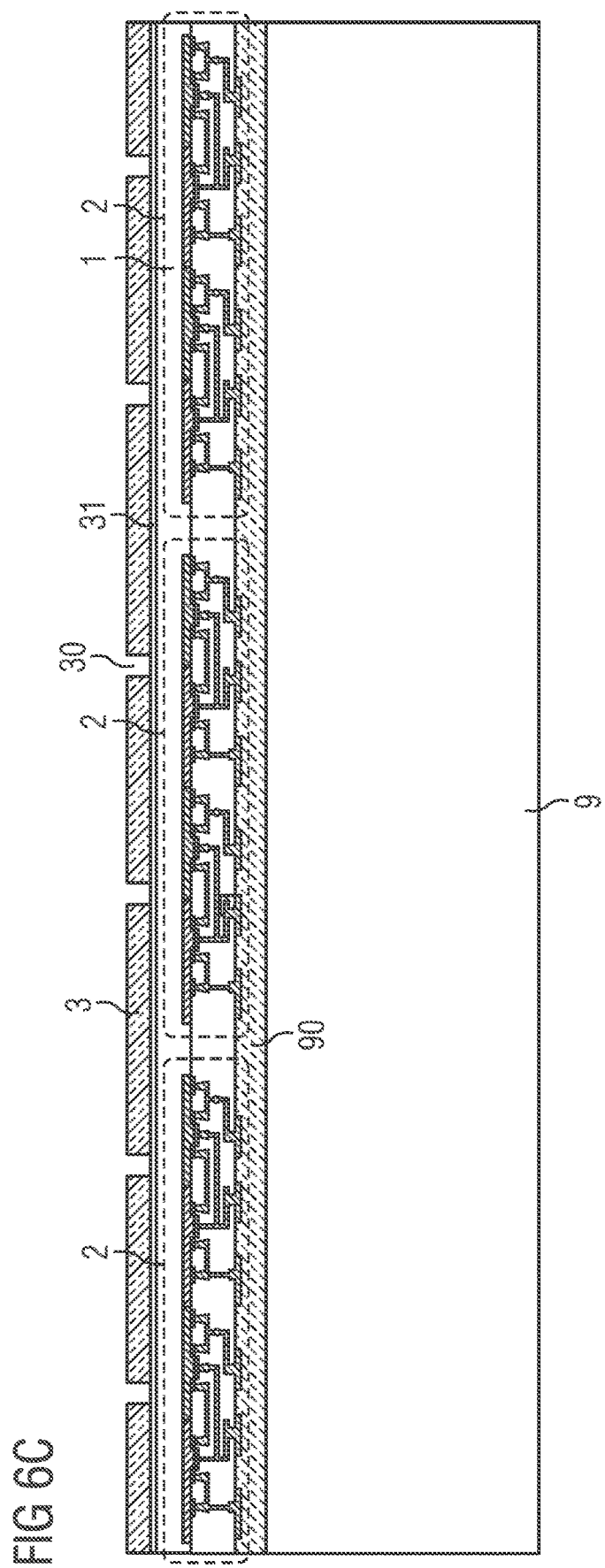

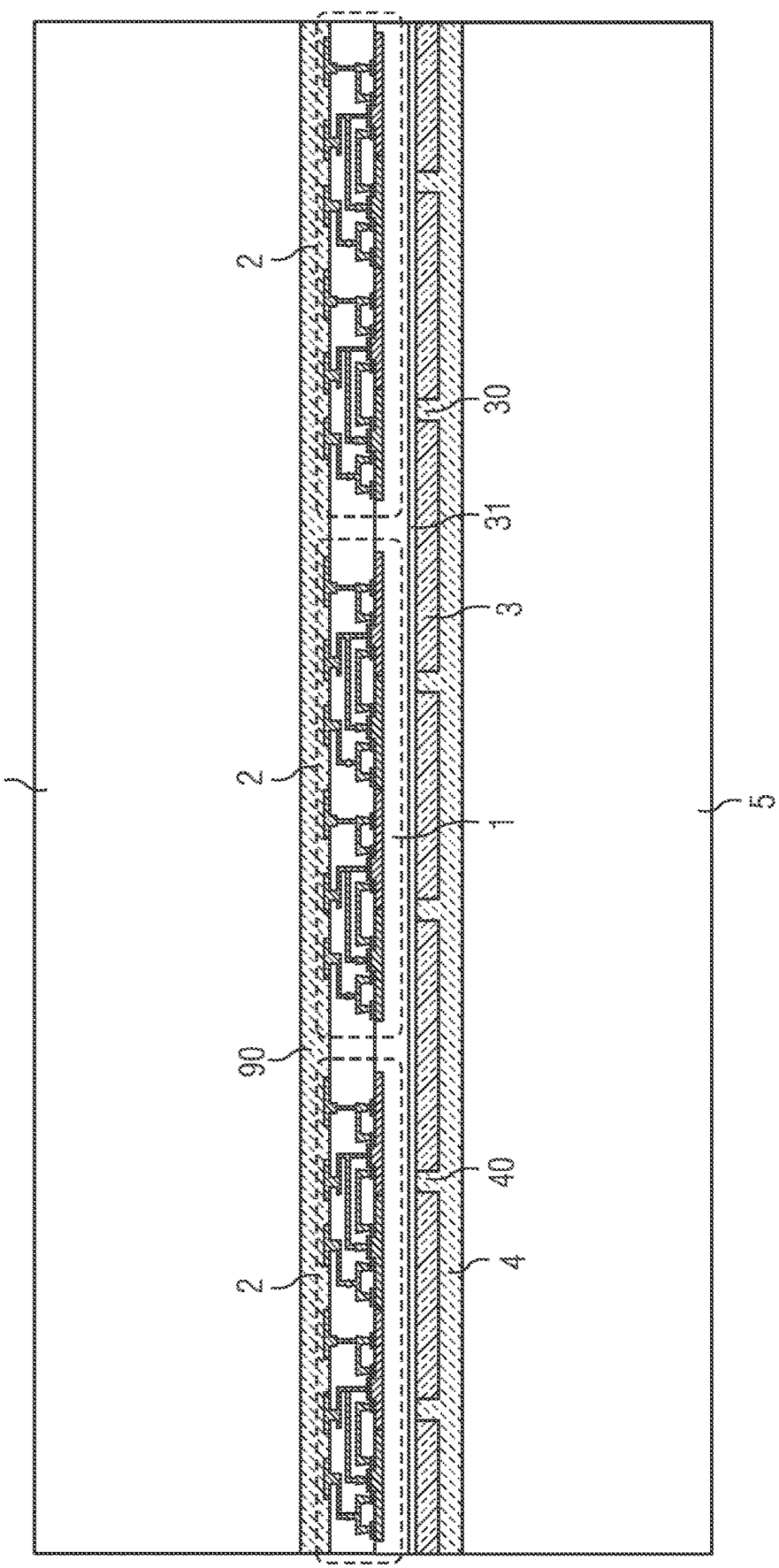

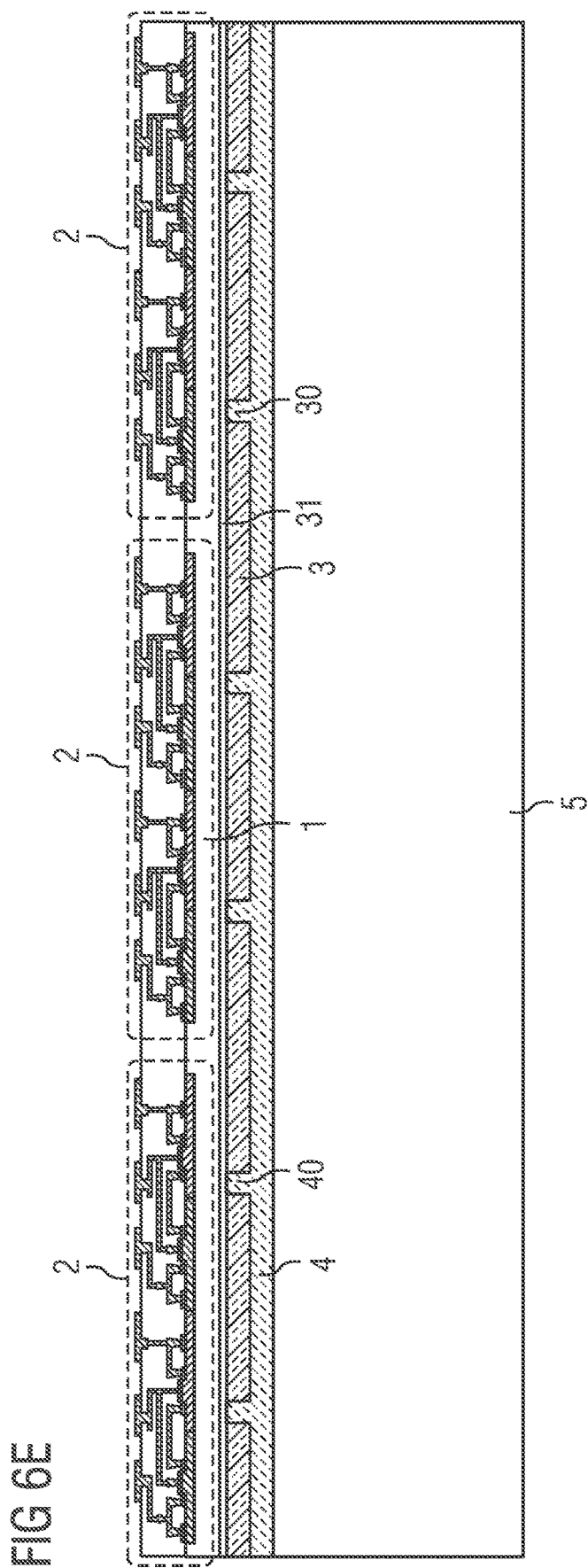

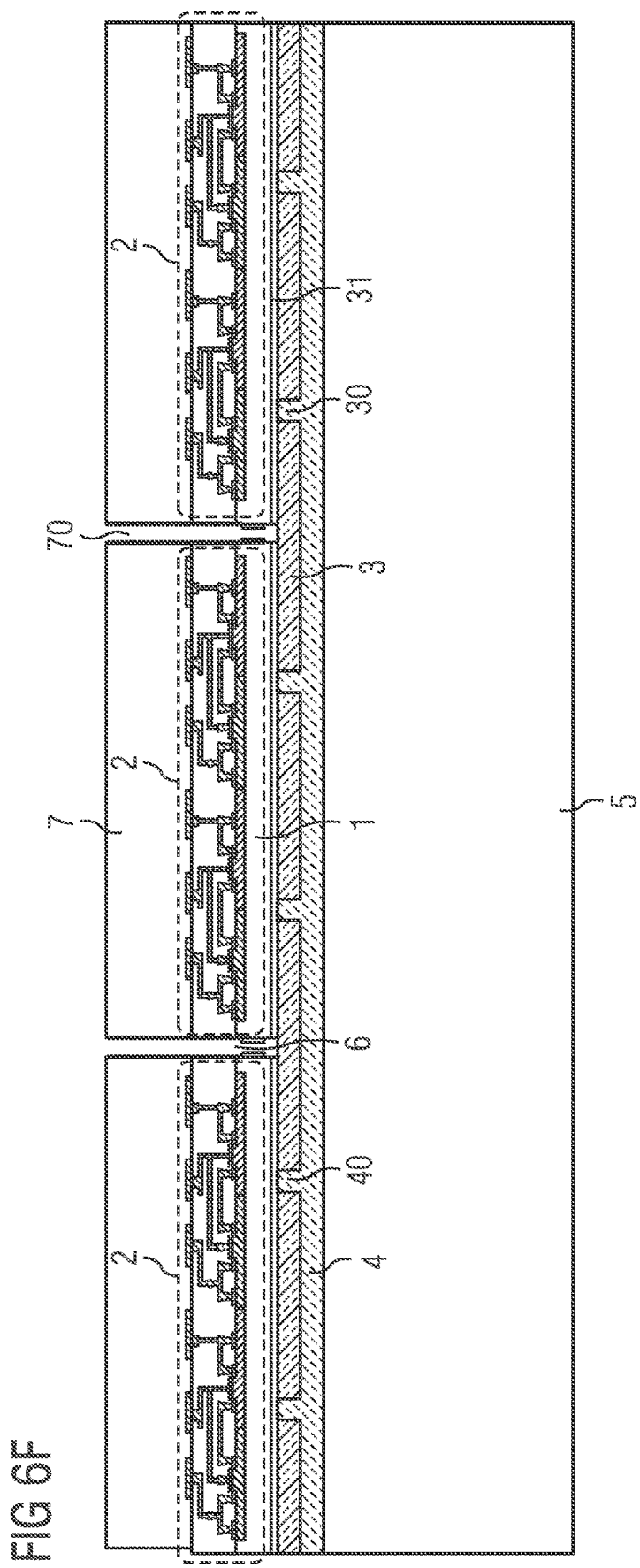

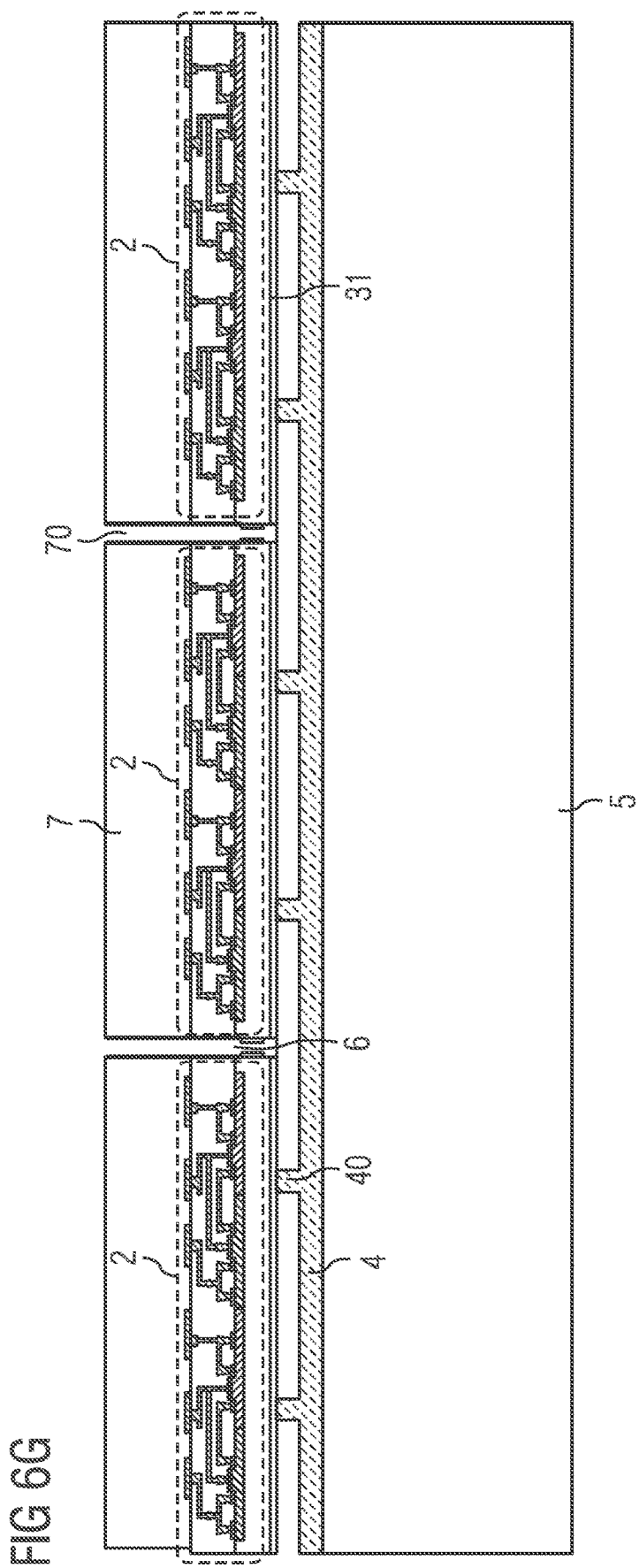

METHOD FOR PRODUCING A PLURALITY OF SEMICONDUCTOR CHIPS AND SEMICONDUCTOR CHIP

CROSS-REFERENCE TO RELATED APPLICATION(S)

This patent application is a national stage entry from International Application No. PCT/EP2018/079335, filed on Oct. 25, 2018, published as International Publication No. WO 2019/081668 A1 on May 2, 2019, and claims priority under 35 U.S.C. § 119 from German patent application 10 2017 125 276.2, filed Oct. 27, 2017, the entire contents of all of which are incorporated herein by reference.

A method for manufacturing a plurality of semiconductor chips is specified. In addition, a semiconductor chip is specified.

A task to be solved is to specify a method that allows the parallel assembly of several semiconductor chips. Another task to be solved is to specify a semiconductor chip manufactured with this method.

These tasks are solved inter alia by the method and the subject-matter of the independent claims. Advantageous embodiments and further developments are the subject of the dependent patent claims.

According to at least one embodiment, the method comprises a step A) in which a semiconductor substrate with several integrated electronic circuits on a top side of the semiconductor substrate is provided.

The semiconductor substrate extends preferably along a main extension plane. The top side of the semiconductor substrate may extend substantially parallel to the main extension plane. For example, the semiconductor substrate is a silicon substrate. On the top side, the electronic circuits are arranged side by side.

Each electronic circuit may comprise one or more electronic components which are interconnected. For example, an electronic circuit comprises one or more transistors and/or one or more diodes and/or one or more resistors and/or one or more capacitors. The transistors may be field effect transistors or bipolar transistors.

The electronic circuits are integrated in the semiconductor substrate. This means that the electronic components of the electronic circuits are partially integrated into the semiconductor substrate. In each electronic circuit, a region of the semiconductor substrate, in particular the region directly below the top side, forms a functional part of at least one electronic component. During the intended operation of the electronic circuits, a current flow or charge carrier transport therefore occurs in this region of the semiconductor substrate. In particular, the semiconductor substrate may comprise n-doped regions and/or p-doped regions below the top surface which are, for example, parts of transistors or diodes.

The semiconductor substrate can be contiguous, preferably simply connected. It spans a plurality of electronic circuits and interconnects the electronic circuits. In other words, the electronic circuits are provided in a wafer composite.

The lateral expansion of the semiconductor substrate, measured parallel to the main extension plane, is between 100 mm and 500 mm, for example.

In particular, the electronic circuits each comprise a wiring layer formed on the top side of the semiconductor substrate. Each wiring layer comprises, for example, an electrically insulating material such as an oxide, in particular silicon oxide. Conductor tracks, especially metallic tracks, are embedded in the electrically insulating material (ILD: interlayer dielectrics). The conductor tracks can be electrically connected to the semiconductor substrate. Parts of the conductor tracks and the semiconductor substrate can form the transistors or diodes or resistors in the electronic circuit. Capacitances in the electronic circuit are formed, for example, within the wiring layer by means of conductor tracks spaced apart from each other. For example, the wiring layer has a thickness between 3 µm and 15 µm inclusive.

The wiring layers of the electronic circuits can initially be contiguous, i.e. form a contiguous wiring layer on the top side of the semiconductor substrate. In the region between the electronic circuits, the contiguous wiring layer is then preferably free of conductor tracks. For example, the wiring layer there is formed exclusively by electrically insulating material.

Alternatively, in a region between the electronic circuits, the contiguous wiring layer can also be formed from a metal, such as aluminum or titanium or copper or tungsten. This metal is then preferably electrically insulated from the conductor tracks of the electronic circuit. Preferably, the contiguous wiring layer in this region is made of a metal over its entire thickness.

According to at least one embodiment, the method comprises a step B) in which a sacrificial layer is applied to one side of the semiconductor substrate. For example, the sacrificial layer can be applied to the electronic circuits. Alternatively, the sacrificial layer can be applied on a bottom side of the semiconductor substrate opposite the electronic circuits.

For example, the sacrificial layer comprises silicon or silicon oxide or consists of one of these materials. The sacrificial layer is preferably applied as a contiguous, in particular simply connected, layer which extends over a plurality of electronic circuits or over all electronic circuits. A thickness of the sacrificial layer is, for example, between 100 nm and 1 µm inclusive.

According to at least one embodiment, the method comprises a step C) in which a plurality of holes are introduced in the sacrificial layer so that at least one hole is produced over each electronic circuit. The holes preferably penetrate the sacrificial layer completely. The holes can be introduced, for example, by using a photolithography mask and an etching process. For example, exactly one hole or several holes, for example a maximum of 20 holes or a maximum of 10 holes, are introduced in the region of each electronic circuit.

According to at least one embodiment, in a step D) the semiconductor substrate together with the electronic circuits and with the sacrificial layer at the front is adhered to a carrier, wherein an adhesive layer is used between the sacrificial layer and the carrier and wherein the adhesive layer fills the holes so that holding elements are formed from the adhesive layer in the holes. The adhesive layer can first be applied to the sacrificial layer and into the holes. The adhesive layer is applied to a side of the sacrificial layer facing away from the electronic circuits. The adhesive layer is preferably formed contiguously.

The dimensions of the holding elements essentially correspond to the dimensions of the holes in the sacrificial layer. For example, the holding elements each have a diameter, measured along the main extension plane, of at most 10 µm or at most 5 µm or at most 3 µm. Alternatively or additionally, the diameter of each holding element is at least 0.5 µm or at least 1 µm. The holding elements are cylindrical, for example. The height of each holding element, measured as an extension perpendicular to the main extension plane of the semiconductor substrate, is, for example, between 100 nm and 1 μm inclusive.

The adhesive layer includes for example benzocyclobutene, BCB for short, and/or an epoxy-based adhesive. Alternatively, the adhesive layer may consist of one of these materials. The epoxy-based adhesive preferably has a glass transition temperature of at least 250° C. The adhesive layer bonds the semiconductor substrate to the carrier. For this purpose, the adhesive layer is cured, for example.

The carrier can be a semiconductor material or a glass or consist of it. The lateral expansion of the carrier is preferably at least as large as the lateral expansion of the semiconductor substrate so that the semiconductor substrate can be placed on the carrier over its entire surface. The lateral expansion is defined as expansion parallel to the respective main expansion plane of the semiconductor substrate or carrier.

According to at least one embodiment, the method comprises a step E) in which the semiconductor substrate is thinned, i.e. reduced in thickness. For example, the semiconductor substrate is ground and/or polished and/or etched. For example, the semiconductor substrate is thinned to a target thickness between 3 μm and 30 μm inclusive. Before that, the thickness of the semiconductor substrate is, for example, at least 100 μm or at least 500 μm.

According to at least one embodiment, the method comprises a step F) in which separation trenches are introduced between the electronic circuits. The separation trenches extend from a side of the electronic circuits remote from the carrier to the sacrificial layer and penetrate the thinned semiconductor substrate. In the region of the separation trenches the sacrificial layer is exposed. The separation trenches can be introduced in the form of a grid, for example, so that each electronic circuit is completely surrounded laterally, i.e. along the main extension plain, by a contiguous separation trench. The width of the separation trenches can be between 1 μm and 20 μm inclusive.

In particular, the separation trenches define the size of the semiconductor chips produced by the process. For example, the lateral dimension of each semiconductor chip or the lateral dimension of the mesh surrounded by a separation trench is at least 10 μm or at least 50 μm. Alternatively or additionally, the lateral dimension is at most 1000 μm or at most 300 μm or at most 200 μm. Each semiconductor chip or mesh surrounded by the separation trenches may have an area of at least 10 μm×10 μm and/or at most 1000 μm×1000 μm.

The separation trenches extend in particular through the thinned semiconductor substrate and through the contiguous wiring layer so that after the insertion of the separation trenches the electronic circuits are no longer connected via the semiconductor substrate or the contiguous wiring layer. The electronic circuits are then preferably connected exclusively via the second carrier.

By introducing the separation trenches, the contiguous semiconductor substrate with the contiguous wiring layer applied to it is thus separated into a plurality of semiconductor chips. Each semiconductor chip then comprises an electronic circuit with a part of the semiconductor substrate and a wiring layer.

According to at least one embodiment, the method comprises a step G) in which the sacrificial layer is removed in the region between the electronic circuits and the carrier so that the electronic circuits are held on the second carrier via the holding elements, in particular exclusively via the holding elements. For example, at least 80% or at least 90% or at least 99% of the sacrificial layer is removed from the region between the electronic circuits and the carrier.

The holding elements form punctual mechanical supports beneath each electronic circuit. In the region next to the holding elements, the electronic circuits are not connected to the carrier so that the electronic circuits in these areas are freely suspended above the carrier without mechanical support. In other words, the electronic circuits are mechanically connected to the carrier via the holding elements only over a small area, for example at most 10% of the total area of the electronic circuit. This allows the electronic circuits to be easily detached from the carrier. However, until the electronic circuits are detached from the carrier, they remain connected to each other in their original configuration thanks to the carrier.

The removal of the sacrificial layer is achieved in particular by etching away the sacrificial layer. For this purpose, an etchant can reach the sacrificial layer via the separation trenches.

In at least one embodiment, the method of manufacturing a plurality of semiconductor chips comprises a step A) in which a semiconductor substrate with several integrated electronic circuits on a top side of the semiconductor substrate is provided. In a step B), a sacrificial layer is applied to one side of the semiconductor substrate. In a step C), holes are introduced in the sacrificial layer so that at least one hole is produced above each electronic circuit. In a step D), the semiconductor substrate is adhered to a carrier with the sacrificial layer at the front, using an adhesive layer between the sacrificial layer and the carrier, and the adhesive layer filling the holes so that holding elements are formed from the adhesive layer in the holes. In a step E) the semiconductor substrate is thinned. In a step F) separation trenches are introduced between the electronic circuits, which extend from a side of the electronic circuits facing away from the carrier to the sacrificial layer and penetrate the thinned semiconductor substrate. In a step G) the sacrificial layer is removed in the region between the electronic circuits and the carrier so that the electronic circuits are held on the carrier via the holding elements.

The use of a sacrificial layer patterned with holes and filling these holes with an adhesive layer so that holding elements are formed, leads, after removal of the sacrificial layer, to the electronic circuits being attached to the carrier only via the holding elements. The holding elements thus form supports or pillars between the carrier and the electronic circuits. Only a very small amount of force is therefore required to detach the electronic circuits from the carrier. Until they are detached, however, the electronic circuits are arranged in their original configuration, i.e. in their original order and at their original distances from each other. This means that a number of electronic circuits can be mounted or printed in parallel, guaranteeing easy detachment from the carrier.

According to at least one embodiment, steps A) to G) are carried out as separate steps one after the other and in the order indicated.

According to at least one embodiment, after step G) a contact area between the holding elements and an electronic circuit is at least 0.1% or at least 1% of the total area of the electronic circuit facing the carrier. Alternatively or additionally, the contact area is at most 10% or at most 8% or at most 5% of the total area of the electronic circuit facing the carrier. The remainder of the area facing the carrier is freely suspended above the carrier and not mechanically connected to the carrier. Such a small proportion of the contact area of the total area of the electronic circuit ensures easy detachment of the electronic circuit from the carrier.

According to at least one embodiment, an intermediate step F1) is carried out to carry out step F), in which a photoresist layer is applied to the side of the electronic circuits facing away from the carrier. The photoresist layer can be a positive or negative photoresist.

According to at least one embodiment, an intermediate step F2) is carried out to carry out step F), in which the photoresist layer is structured with trenches, the trenches being formed where the separation trenches are to be formed later. The trenches in the photoresist layer completely penetrate the photoresist layer and define the position of the separation trenches to be formed later. In particular, the trenches in the photoresist layer are formed all around the electronic circuits and form a grid, for example.

According to at least one embodiment, an intermediate step F3) is carried out to carry out step F) by applying an etching process to create the separation trenches in the region of the trenches. For example, a dry chemical or wet chemical etching process is used. The etchant then passes through the trenches to the materials connecting the electronic circuits and can etch separation trenches in this material.

According to at least one embodiment, steps F1), F2) and F3) are carried out in the specified order.

According to at least one embodiment, the carrier is a transparent carrier, for example a glass carrier. "Transparent" here means transparent for visible light. The transparent carrier is advantageous for detecting structures of electronic circuits. Such structures can be metallic contact structures or markings, for example. These structures can be used to adjust the separation trenches or trenches. For example, a system with backside adjustment is used for this purpose.

Alternatively, it is also possible that the carrier is made of a non-transparent material such as silicon. In this case, the position of the structures through the material of the semiconductor substrate or through the material of the carrier can be determined by means of an IR camera and the adjustment for the separation trenches or trenches can be made on the basis of this. In this case a system with front side adjustment can be used.

According to at least one embodiment, an anisotropic fluorine-based etching process is performed to produce the separation trenches in step F). The etching process can be dry chemical, for example. Such an etching process is particularly suitable for penetrating the semiconductor substrate. For example, a fluorine-containing gas such as $SF_6$ is used. Such an etching process is also known as Bosch process. In this process, fluoropolymers are formed in the region of the penetrated semiconductor substrate, forming a lateral etch stop layer. Such an etching process can produce trenches with particularly steep lateral flanks.

To penetrate the contiguous wiring layer in the regions between the electronic circuits with the separation trenches, another etchant, such as hydrofluoric acid, can be used. It is particularly advantageous if, as explained above, the contiguous wiring layer in the region between electronic circuits and where the separation trenches are to be formed is made of a metal. The separation trenches can then be formed through the metal. Metal is often easier to etch than, for example, oxide. Aluminium or titanium, for example, are suitable metals. The metal can then be etched selectively to the surrounding oxide of the contiguous connecting layer.

According to at least one embodiment, a dry chemical etching process is used to remove the sacrificial layer in step G). For example, the same anisotropic, fluorine-based etching process as in step F) can be used to remove the sacrificial layer. For example, $SF_6$ or $XeF_2$ is used as etchant.

According to at least one embodiment, in step G) the etchant used reaches the sacrificial layer via the separation trenches. For example, the etchant removes at least 80% or at least 90% or at least 99% of the sacrificial layer in the region between the electronic circuits and the carrier.

In accordance with at least one embodiment, isolation trenches extend between two, in particular between each two, electronic circuits and/or in the region of the electronic circuits from the top side of the semiconductor substrate into the semiconductor substrate. The isolation trenches project, for example, at least 3 µm or at least 4 µm or at least 5 µm deep into the semiconductor substrate. Alternatively or additionally, the depth of the isolation trenches is at most 10 µm or 9 µm or 8 µm. For example, the width of the isolation trenches is between 1 µm and 3 µm inclusive. Preferably, the isolation trenches protrude deeper into the semiconductor substrate than electronically functional regions of the electronic circuits, especially as n- and/or p-doped regions of the semiconductor substrate. Such isolation trenches are also known as deep trench insulation.

In the region of electronic circuits, for example between two adjacent transistors of an electronic circuit, the isolation trenches can also be less deep. For example, such so-called shallow trench insulation has depths of at most 3 µm or at most 2 µm.

The isolation trenches can run laterally completely around the electronic circuits and define the lateral expansion of an electronic circuit.

According to at least one embodiment, the isolation trenches are filled with an electrically insulating material such as silicon oxide. For example, the electrically insulating material of the wiring layer fills the isolation trenches.

According to at least one embodiment, in step E) the semiconductor substrate is thinned until the isolation trenches, in particular the electrically insulating material of the isolation trenches, are exposed. The exposed isolation trenches can then serve as orientation points for the adjustment of the separation trenches.

In addition to their function as orientation points, the isolation trenches can also provide electrical insulation between electronic components within an electronic circuit. For example, the distance between an isolation trench and an electronic component is at least 5 µm or at most 8 µm.

To make the isolation trenches or the electrically insulating material within the isolation trenches visible after the semiconductor substrate has been thinned, another etchant may be used which has different etch rates for the electrically insulating material and the material of the semiconductor substrate.

According to at least one embodiment, in step F) the separation trenches are formed through the exposed isolation trenches. Advantageously, etching is then not required through the semiconductor material of the semiconductor substrate, but only through an electrically insulating material, such as silicon oxide.

According to at least one embodiment, two isolation trenches are formed between two electronic circuits, in particular between each two electronic circuits, which laterally delimit a separation region of the semiconductor substrate. In particular, the separation region is separated from the electronic circuits on both sides by the isolation trenches. For example, after the semiconductor substrate has been thinned, the separation region is electrically isolated from the other regions of the semiconductor substrate by the isolation trenches.

According to at least one embodiment, in step F) the separation trenches are formed through the separation region. When forming the separation trenches, the isolation trenches can limit the width of the separation trenches, since the material in the isolation trenches is not attacked by the etchant used, for example, or is attacked less strongly than the semiconductor material in the separation regions.

According to at least one embodiment, each electronic circuit has a first contact structure arranged above the top side for electrical contacting of the electronic circuit. "Above the top side" means that the contact structure is arranged outside the semiconductor substrate. The first contact structure is formed, for example, in the wiring layer of the electronic circuit. The first contact structure is preferably metallic. The first contact structure may be electrically isolated and spaced from the top side of the semiconductor substrate by a layer of electrically insulating material. This electrically insulating layer is formed in particular from an oxide, preferably silicon oxide. For example, the thickness of the electrically insulating layer is at most 1 μm.

According to at least one embodiment, the method comprises a step E1) following step E), in which contact holes are introduced into the thinned semiconductor substrate so that the first contact structures are exposed. The contact holes are introduced, for example, from a side of the thinned semiconductor substrate facing away from the electronic circuits and penetrate the thinned semiconductor substrate completely. The introduction of the contact holes can be done by an etching process, for example. For example, an etching mask produced by a lithography process is used for this purpose. The diameter of the contact holes is, for example, between 2 μm and 10 μm inclusive.

After the contact holes are formed through the semiconductor substrate, the optional electrically insulating layer between the first contact structure and the top side can be etched through. A different etchant can be used for this than for etching through the semiconductor substrate.

According to at least one embodiment, the process comprises a step E2) following step E), in which an electrically conductive material, in particular a metal, is inserted into the contact holes. The electrically conductive material is preferably brought into direct electrical and mechanical contact with the first contact structures. Via the electrically conductive material, the electronic circuits can then be electrically contacted from a side of the thinned semiconductor substrate remote from the electronic circuits. Before inserting the electrically conductive material, the inner walls of the contact holes can be passivated with a passivation layer. The passivation layer is then removed in a bottom region so that the first contact structures are exposed. Only then is the electrically conductive material filled into the contact holes.

Preferably, steps E1) and E2) are carried out before step F).

According to at least one embodiment, in the region below the first contact structures, the semiconductor substrate comprises a first contact region in each case, which is laterally surrounded by an electrically insulating boundary trench. The contact region comprises or consists of the semiconductor material of the semiconductor substrate. Each boundary trench can completely surround the associated contact region laterally. Each boundary trench may be contiguous. For example, the trenches are filled with an electrically insulating material such as an oxide, especially silicon oxide. The boundary trenches extend from the top side of the semiconductor substrate into the semiconductor substrate. The depths and widths of the boundary trenches can be chosen in the same way as the depths and widths of the isolation trenches defined above. In particular, the boundary trenches are also so-called deep trench insulations.

According to at least one embodiment, in step E) the semiconductor substrate is thinned until the boundary trenches and the contact regions surrounded by them are exposed. In plan view of the bottom side of the thinned semiconductor substrate facing away from the electronic circuits, each contact region is then surrounded by a contiguous path of a boundary trench. For example, the contact region seen in the plan view of the bottom side has a diameter of 50 μm or 30 μm at most.

According to at least one embodiment, the method comprises a step E3), following step E), in which an electrically conductive material is applied to the thinned semiconductor substrate in the contact regions. On the bottom side of the thinned semiconductor substrate remote from the electronic circuits, the contact region is thus electrically conductively connected to the electrically conductive material. On the top side, the contact region is electrically conductively connected to the first contact structure. This allows the first contact structures to be contacted via the bottom side of the thinned semiconductor substrate. The boundary trenches provide electrical insulation between the contact regions and the rest of the semiconductor material of the semiconductor substrate.

In order to increase the electrical conductivity of the contact region from the bottom side to the top side of the thinned semiconductor substrate, metallic vias, for example made of tungsten or aluminum, can be made or inserted in the contact regions. The metallic vias through the thinned semiconductor substrate are then completely surrounded laterally by the boundary trench. The diameter of such a metallic via, for example, is between 1 μm and 10 μm inclusive. It can, for example, be produced by a CVD process.

Preferably, step E3) is performed before step F).

According to at least one embodiment, the process comprises a step E4), following step E), in which optoelectronic devices are deposited on the bottom side of the thinned semiconductor substrate facing away from the electronic circuits. In this process, the optoelectronic devices are electrically conductively connected to the electronic circuits via the electrically conductive material. The optoelectronic devices can be LED chips or laser diode chips, for example. The lateral expansion of the device is between 10 μm and 80 μm. Step E4) is preferably performed before step F).

According to at least one embodiment, after step A) and before step B), the semiconductor substrate with the electronic circuits is first applied to an auxiliary carrier. After application, the electronic circuits are preferably arranged between the auxiliary carrier and the semiconductor substrate. Step E) is then carried out. Only after step E) are steps B), C), D), F) and G) carried out, in particular in this order. The sacrificial layer and the adhesive layer are preferably applied to a side of the thinned semiconductor substrate facing away from the auxiliary carrier.

According to at least one embodiment, the auxiliary carrier is removed after step D) and preferably before step F).

According to at least one embodiment, each electronic circuit comprises a region of the semiconductor substrate or of the thinned semiconductor substrate and an electronic component formed with this region of the semiconductor substrate. In particular, each electronic circuit comprises at least one, preferably several such electronic components.

According to at least one embodiment, each electronic circuit comprises a wiring layer on the semiconductor substrate. The wiring layer serves for contacting the electronic component.

A wiring layer comprises, for example, several conductor tracks embedded in an electrically insulating material.

According to at least one embodiment, each electronic circuit comprises a second contact structure on a side of the wiring layer facing away from the semiconductor substrate. The electronic circuit is electrically contactable via the second contact structure. The second contact structure comprises or consists of, for example, Al.

According to at least one embodiment, the wiring layers of the electronic circuits are connected in step A) and form a contiguous wiring layer.

According to at least one embodiment, the contiguous wiring layer is metallic in the region of the separation trenches to be formed.

According to at least one embodiment, the separation trenches are formed through the contiguous wiring layer in step F).

According to at least one embodiment, a dielectric layer is inserted between the sacrificial layer and the adhesive layer after step C). The dielectric layer is preferably simply-connected. The dielectric layer comprises for example $Al_2O_3$ or $SiO_2$ or $SiN_x$ or consists of one of these materials.

According to at least one embodiment, the dielectric layer partially fills the holes and separates the holding elements from the semiconductor substrate. When the electronic circuits are detached from the holding elements, the interface between the dielectric layer and the holding elements preferably tears open. This is more gentle on the electronic circuits.

Preferably, a second, in particular simply-connected, dielectric layer is formed between the sacrificial layer and the semiconductor substrate. In the region of the holes, the dielectric layer can then border directly on the second dielectric layer. The second dielectric layer preferably comprises a different material than the dielectric layer.

According to at least one embodiment, the method comprises a step H), which preferably follows step G), in which the electronic circuits are detached from the carrier so that individual semiconductor chips separated from one another are produced. Each semiconductor chip comprises one, preferably exactly one electronic circuit.

In addition, a semiconductor chip is specified. The method described herein is particularly suitable for manufacturing such a semiconductor chip. This means that all features disclosed in connection with the semiconductor chip are also disclosed for the method and vice versa.

According to at least one embodiment, the semiconductor chip comprises a semiconductor substrate with an integrated electronic circuit on a top side of the semiconductor substrate.

According to at least one embodiment, the electronic circuit comprises a wiring layer on the top side of the semiconductor substrate.

According to at least one embodiment, the electronic circuit comprises a first contact structure in the wiring layer.

According to at least one embodiment, the first contact structure is electrically conductively connected to a contact region of the semiconductor substrate. Preferably, the contact region comprises or consists of the semiconductor material of the semiconductor substrate.

According to at least one embodiment, the contact region extends completely from the top side through the semiconductor substrate to a bottom side of the semiconductor substrate opposite the top side.

According to at least one embodiment, the contact region is electrically conductively connected with an electrically conductive material, preferably a metallic material, on the bottom side.

According to at least one embodiment, the contact region is laterally completely surrounded by an electrically insulating boundary trench, which extends from the top side to the bottom side of the semiconductor substrate. The boundary trench is filled, for example, with an electrically insulating material, such as oxide, in particular silicon oxide. The boundary trenches may be formed of deep trench insulations.

According to at least one embodiment, the semiconductor chip comprises an optoelectronic device on the bottom side of the semiconductor substrate. The optoelectronic device is electrically connected to the electronic circuit via the electrically conductive material and the contact region. The electronic device overlaps with the electronic circuit along the main expansion plane of the semiconductor substrate.

In the following, a method of manufacturing a plurality of semiconductor chips described herein and a semiconductor chip described herein are explained in more detail with reference to drawings by using exemplary embodiments. Same reference signs indicate same elements in the individual figures. However, the size ratios involved are not to scale, individual elements may rather be illustrated with an exaggerated size for a better understanding.

Figure 3B:
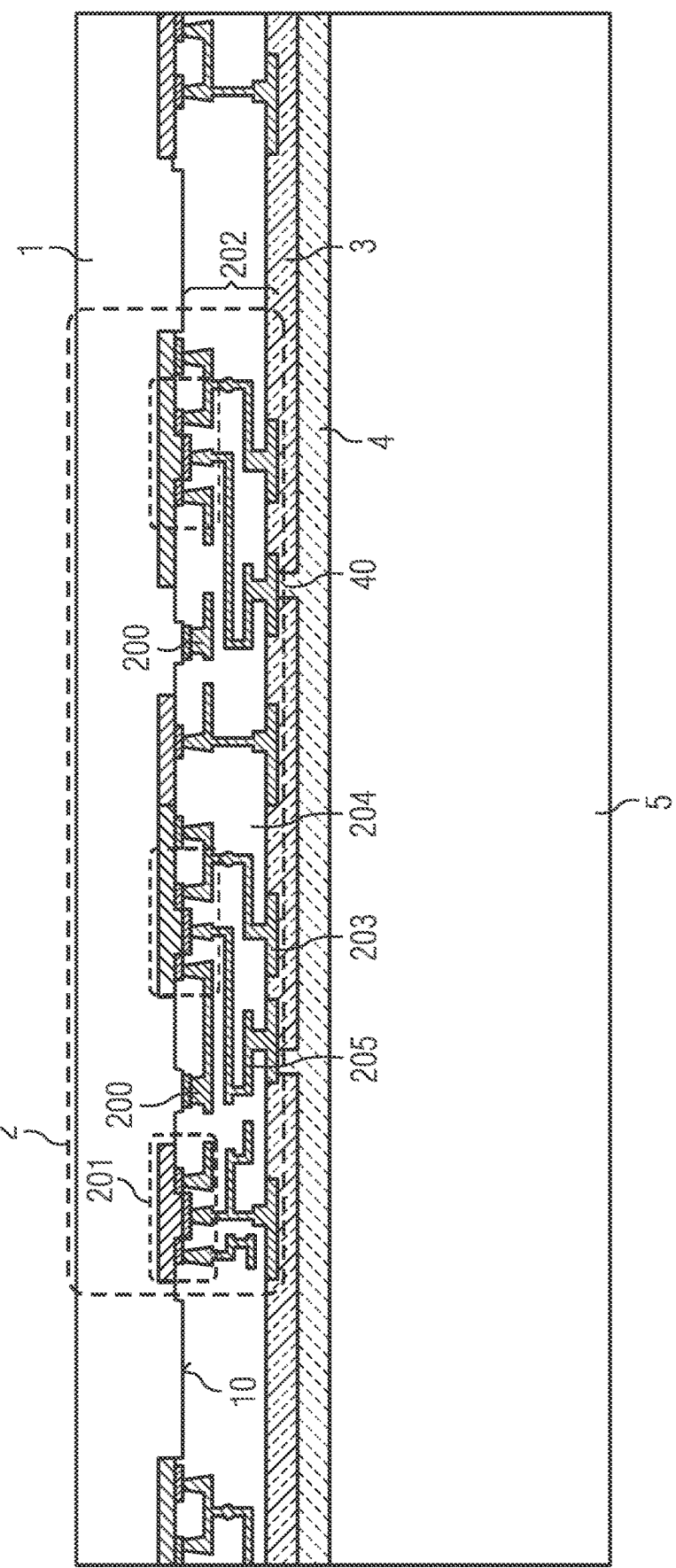
Figure 3C:
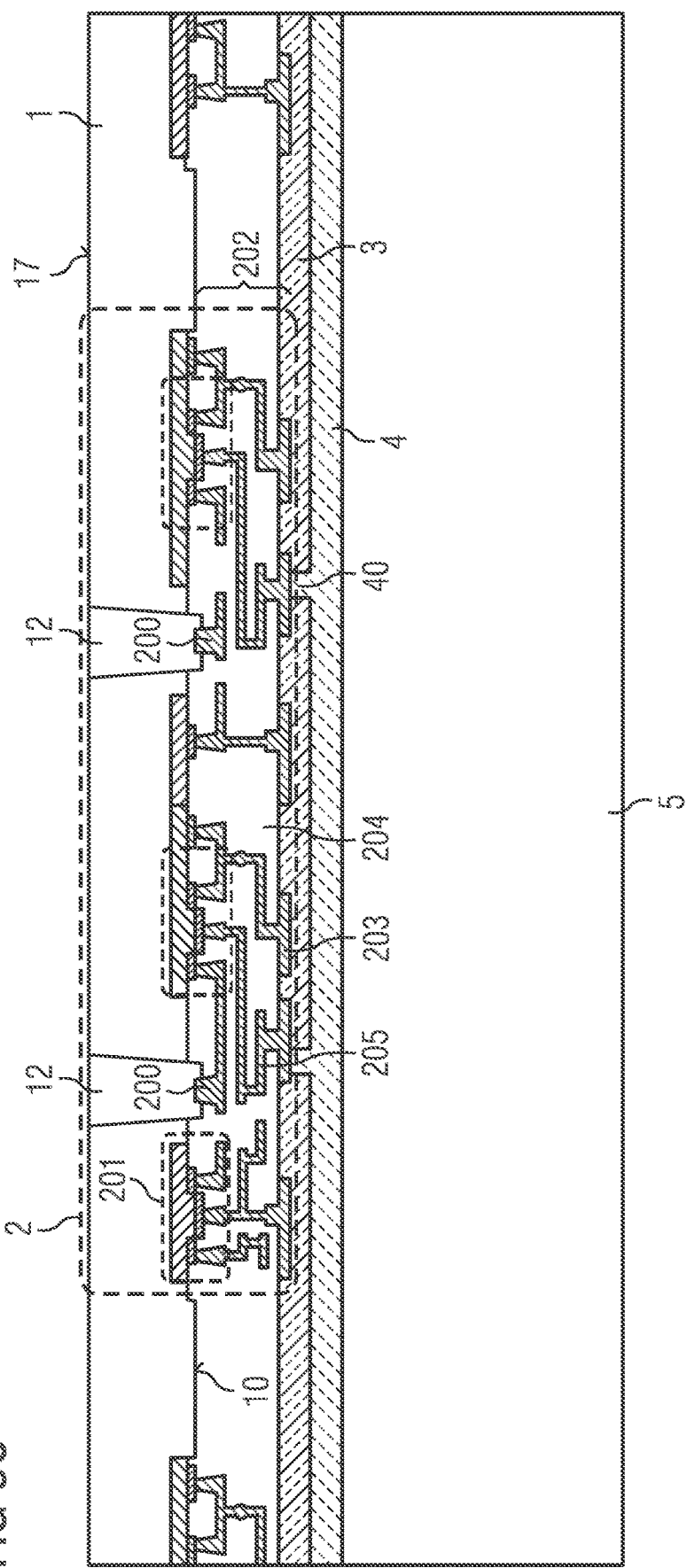
Figure 4B:
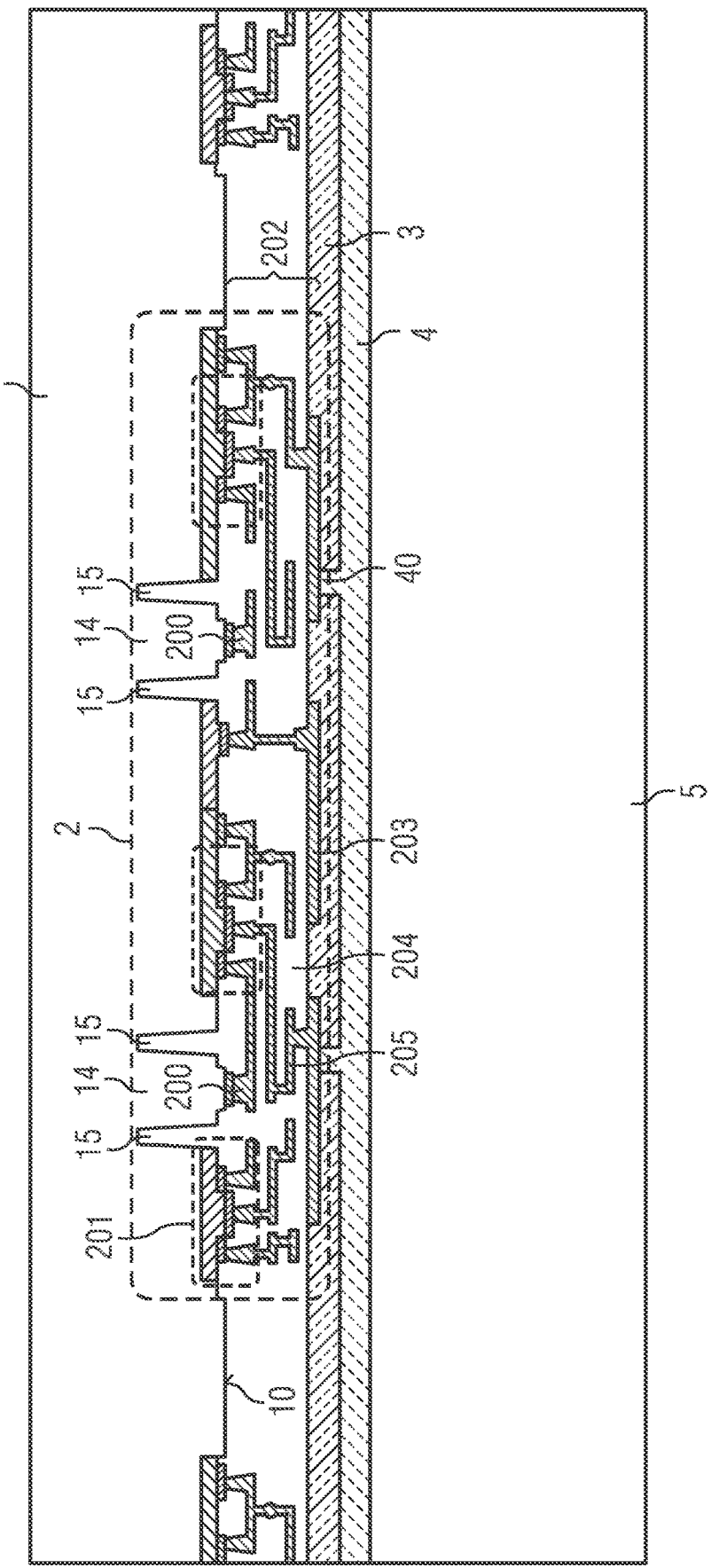
Figure 4C:
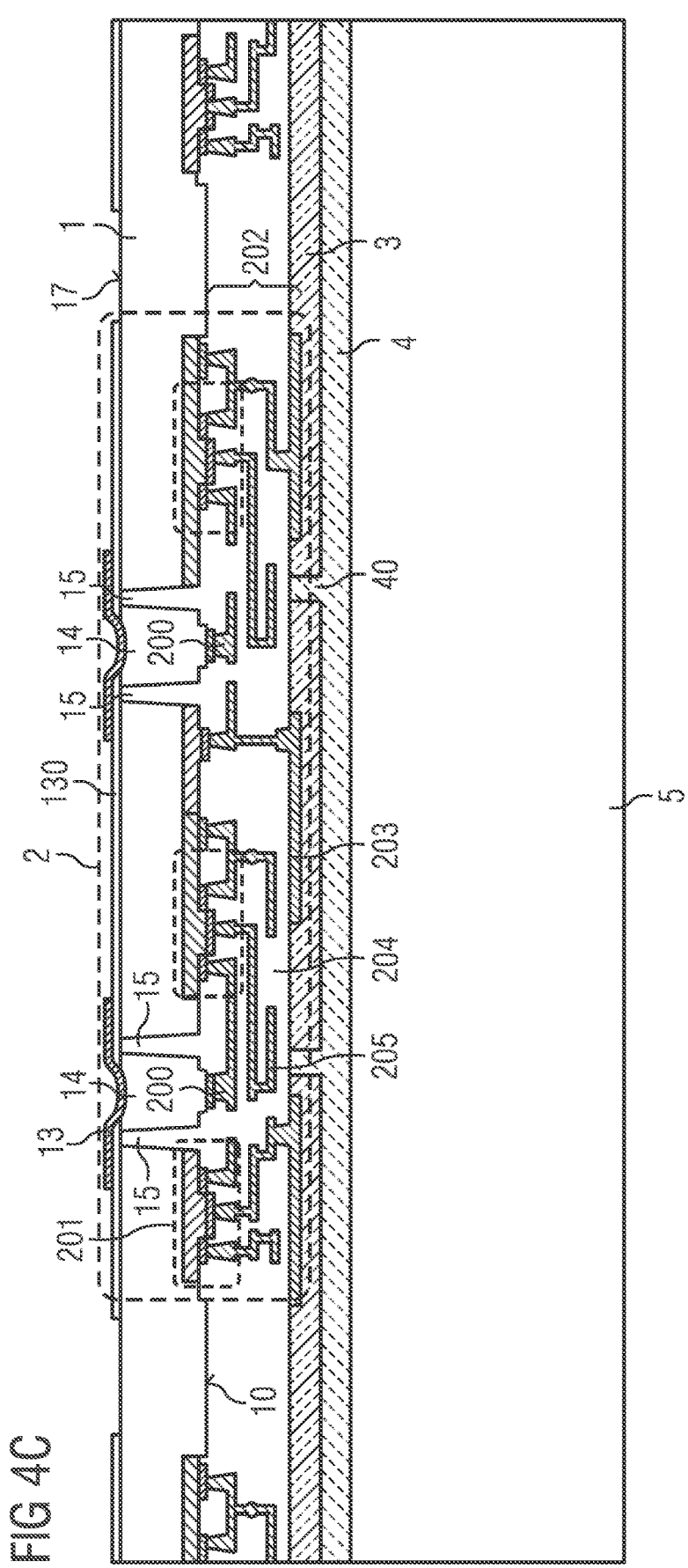
Figure 4D:
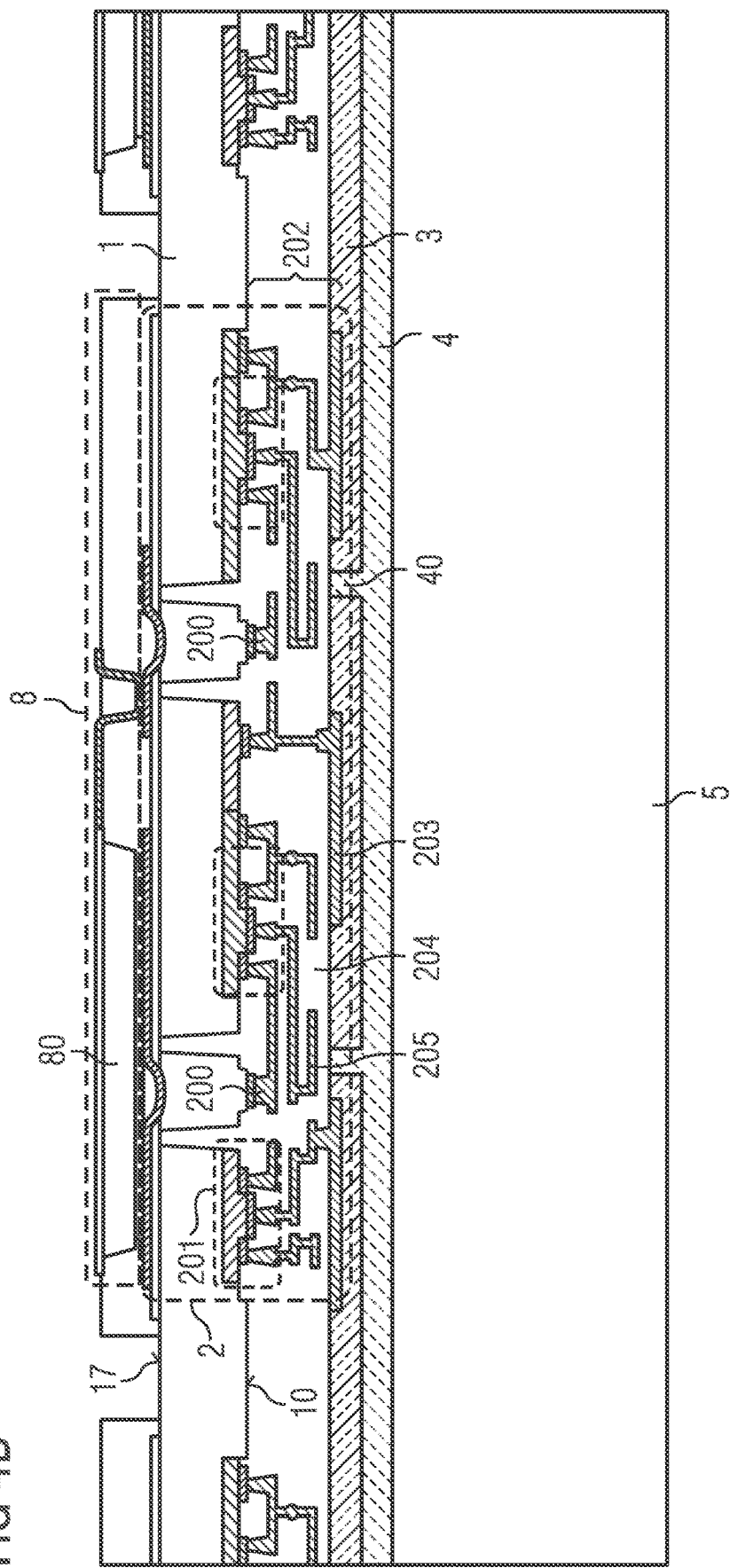
Figure 5A:
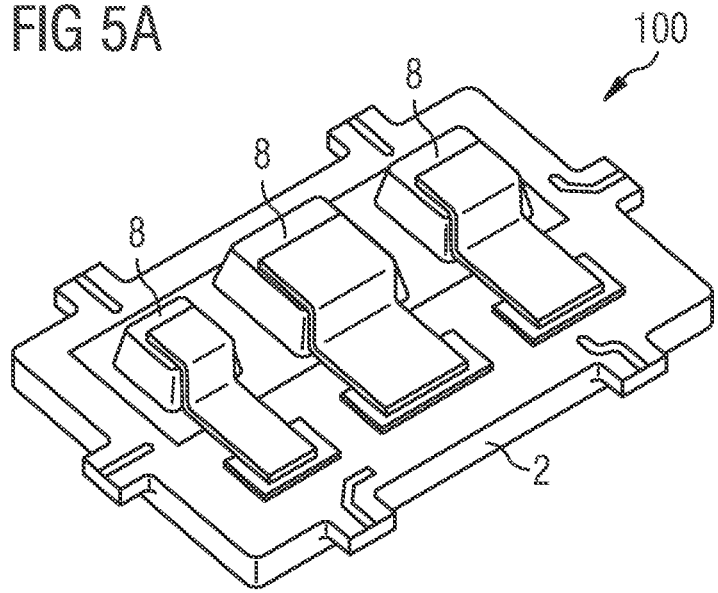
Figure 5B:
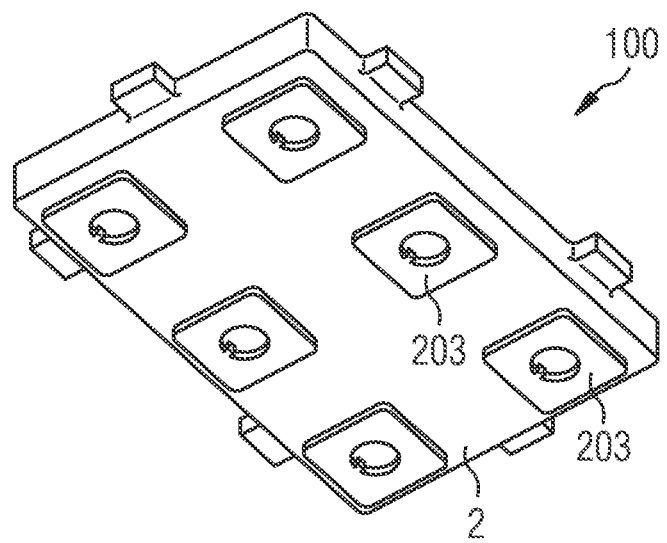
Figure 7:
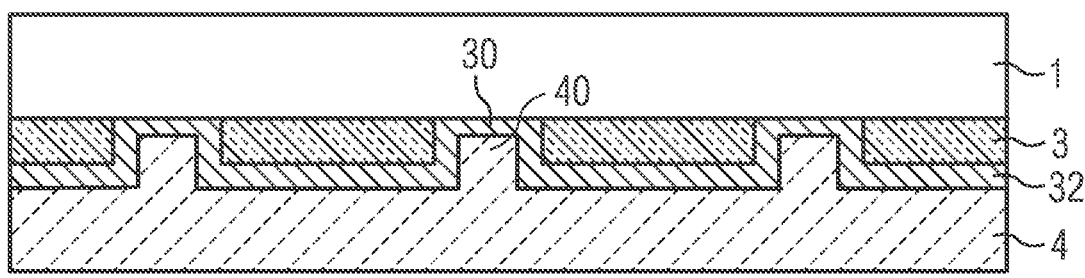

FIGS. 1A to 1G show different positions in a first exemplary embodiment of the method, FIGS. 2A to 2C show different positions in a second exemplary embodiment of the method, FIGS. 3A to 3E show different positions in a third exemplary embodiment of the method, FIGS. 4A to 4E show different positions in a fourth exemplary embodiment of the method, FIGS. 5A and 5B show perspective views of exemplary embodiment of the semiconductor chip, FIGS. 6A to 6G show different positions in a fifth exemplary embodiment of the method, FIG. 7 shows a position in a sixth exemplary embodiment of the method.

FIG. 1A shows a first position in a first exemplary embodiment of the method. A semiconductor substrate 1 with a top side 10 is provided. A plurality of laterally adjacent integrated electronic circuits 2 are formed at or on the top side 10. The electronic circuits 2 are integrated in the semiconductor substrate 1 in places. In particular, the electronic circuits 2 comprise electronic components 201, such as transistors and/or diodes, which are partially formed by n-doped and/or p-doped regions below the top side 10 of the semiconductor substrate 1. The semiconductor substrate 1 is, for example, a silicon substrate.

Each electronic circuit 2 further comprises a wiring layer 202 on the top side 10 of the semiconductor substrate 1. The wiring layers 202 of the various electronic circuits 2 are initially formed in a contiguous manner. Each wiring layer 202 comprises an electrically insulating material 204, for example silicon oxide, in which a plurality of conductor tracks 205 is embedded. On the side facing away from the semiconductor substrate 1, each electronic circuit 2 comprises a second contact structure 203, via which the electronic circuit 2 can be contacted externally. In the region between two electronic circuits 2, the wiring layers 202 are connected to each other by the electrically insulating material 204.

FIG. 1B shows a second position in the method in which a sacrificial layer 3, for example of silicon, is applied to the sides of the electronic circuits 2 facing away from the semiconductor substrate 1. The sacrificial layer 3 is interspersed with several holes 30. At least one such hole 30 in the sacrificial layer 3 is provided in the region of each electronic circuit 2.

FIG. 1C shows a third position of the method. An adhesive layer 4, for example of BCB, is applied to the side of the sacrificial layer 3 facing away from the semiconductor substrate 1. The adhesive layer 4 fills up the holes 30 in the sacrificial layer 3, resulting in holding elements 40 made of the material of the adhesive layer 4 in the holes 30. The semiconductor substrate 1 with the electronic circuits 2 is bonded to a carrier 5 by means of the adhesive layer 4. The carrier 5 consists of glass, for example.

In the fourth position of the method shown in FIG. 1D, the semiconductor substrate 1 is thinned. For this purpose, the semiconductor substrate 1 has been ground or polished or etched, for example, from a side facing away from carrier 5. For example, the semiconductor substrate 1 is thinned to a target thickness between 5 μm and 20 μm inclusive. In FIG. 1D, the carrier 5 is the component stabilizing the electronic circuits 2.

FIG. 1E shows a fifth position of the method. A photoresist layer 7 is deposited on the side of the electronic circuits 2 facing away from the substrate 5. The photoresist layer 7 is structured with trenches 70. The trenches 70 are formed in the region between the electronic circuits 2. Furthermore, a separation trench 6 is formed between the electronic circuits 2. For the separation of the semiconductor substrate 1, for example, an anisotropic, dry-chemical and fluorine-based etching process using the structured photoresist layer 7 as etching mask was used. For example, a different etchant was used to penetrate the material connecting the wiring layer 202 with the separation trenches 6.

FIG. 1E shows that the separation trenches 6 extend to the sacrificial layer 3, exposing the sacrificial layer 3 in the region of the separation trenches 6.

FIG. 1F shows a sixth position of the method in which the sacrificial layer 3 is removed in the region below the electronic circuits 2. This leaves the holding elements 40, by which the electronic circuits 2 are attached to the carrier 5. The contact area between an electronic circuit 2 and the holding elements 40 arranged below is, for example, at most 10% of the total area of the electronic circuit 2 facing the carrier 5. The holding elements 40 fix the electronic circuits 2 weakly but positionally stable to the carrier 5.

An anisotropic etching process was again used, for example, to remove the sacrificial layer 3. The etchant used for this can have reached the sacrificial layer 3 via the separation trenches 6. The etchant has removed at least 99% of the sacrificial layer 3 in the region below the electronic circuits 2.

FIG. 1G shows a seventh position of the method. The electronic circuits 2 are detached from the carrier 5. Individual semiconductor chips 100 remain, each comprising a section of the thinned semiconductor substrate 1 with an electronic circuit 2 integrated therein. The electronic circuits 2 each comprise a wiring layer 202 and several electronic components 201. A side of the thinned semiconductor substrate 1 facing away from the wiring layer 202 forms a bottom side 17 of the semiconductor chip 100.

FIG. 2A shows a first position of a second exemplary embodiment of the method. As in FIG. 1A, a semiconductor substrate 1 is shown with a plurality of electronic circuits 2 formed at the top side 10. Starting from the top side 10, isolation trenches 11 extend into the semiconductor substrate 1. The isolation trenches 11 are filled with an electrically insulating material, in particular with the electrically insulating material 204 of wiring layer 202.

On the one hand, the isolation trenches 11 are formed in the region between two transistors 201 of electronic circuit 2 and electrically insulate the transistors 201 from each other. On the other hand, the isolation trenches 11 are formed in the region between each two electronic circuits 2. In the present case, two isolation trenches 11 spaced apart from each other are formed between each two electronic circuits 2. Between the two isolation trenches 11 a separation region 16 made of the material of the semiconductor substrate 1 is provided.

The isolation trenches 11 have, for example, a depth between 5 μm and 8 μm inclusive, a width between 2 μm and 3 μm inclusive and a distance to the nearest transistors 201 or the nearest electronic circuits 2 between 5 μm and 8 μm inclusive.

In the second position of the method, shown in FIG. 2B, the semiconductor substrate 1 with the electronic circuits 2 is again placed on a carrier 5. A sacrificial layer 3 and an adhesive layer 4 are formed between the carrier 5 and the semiconductor substrate 1. Furthermore, the semiconductor substrate 1 is again thinned. The semiconductor substrate 1 was thinned until the isolation trenches 11 were exposed and the electrically insulating material in the isolation trenches 11 became visible on a bottom side 17 of the semiconductor substrate 1 facing away from the carrier 5. Optionally, a deco-etching process can still be applied which has a different etching rate for the electrically insulating material in the region of the isolation trenches 11 than for the semiconductor material of the semiconductor substrate 1. Thus, a visible difference in height between the isolation trenches 11 and the semiconductor substrate 1 can be created on the bottom side 17.

FIG. 2C shows a third position of the method. A photoresist layer 7 structured with trenches 70 was used as an etch mask to form isolation trenches 6 between the electronic circuits 2. The exposed isolation trenches 11 can be used as orientation points for positioning the trenches 70.

In this case, the separation trenches 6 are formed through the isolation trenches 11. This avoided etching through the semiconductor material of the thinned semiconductor substrate 1 and risking damage to the semiconductor substrate 1. Alternatively, it would also be possible to form the separation trenches 6 between the isolation trenches 11 and through the separation regions 16. In this case, only the semiconductor material of semiconductor substrate 1 would be etched to form the separation trenches 6. The isolation trenches 11 would represent lateral passivations to protect the electronic circuits 2 from the etchant.

FIG. 3A shows a first position of a third exemplary embodiment of the method. A semiconductor substrate 1 is provided with an electronic circuit 2 formed on the top side 10. The electronic circuit 2 includes a first contact structure 200 in the region above the top side 10, i.e., within the wiring layer 202. The first contact structure 200 is electrically isolated from the semiconductor substrate 1, for example, by an insulating layer such as a field oxide layer.

FIG. 3B shows a second position of the method in which the semiconductor substrate 1 is mounted on a carrier 5, and a sacrificial layer 3 and an adhesive layer 4 are formed between the carrier 5 and the semiconductor substrate 1. The semiconductor substrate 1 is thinned to a target thickness.

FIG. 3C shows a third position of the method. Contact holes 12 are introduced into the thinned semiconductor substrate 1. The contact holes 12 are located, in particular, in the region of the semiconductor substrate 1 above the first contact structures 200. The first contact structures 200 are exposed in the contact holes 12.

A fourth position of the method is shown in the FIG. 3D. An electrically conductive material 13 in the form of a metallic layer is inserted in the contact holes 12. The electrically conductive material 13 is in direct contact with the first contact structures 200. Furthermore, the electrically conductive material 13 extends from the first contact structures 200 to a bottom side 17 of the thinned semiconductor substrate 1, which is opposite the top side 10. The electronic circuit 2 can be electrically contacted via the bottom side 17. A passivation layer 130 is formed between the electrically conductive material 13 and the semiconductor material of the semiconductor substrate 1.

FIG. 3E shows a fifth position of the method. Again, a photoresist layer 7 and trenches 70 in the photoresist layer 7 have been used to form separation trenches 6 between the electronic circuits 2. Below the electronic circuits 2, the sacrificial layer 3 has been removed so that the electronic circuits 2 are only held to the carrier 5 by the holding elements 40.

FIG. 4A shows a first position of a fourth exemplary embodiment of the method. Again, an electronic circuit 2 comprises first contact structures 200 above the top side 10 of the semiconductor substrate 1. Contact regions 14 of the semiconductor substrate 1 are formed below the first contact structures 200. This means that the contact regions 14 consist of the semiconductor material of the semiconductor substrate 1. The contact regions 14 are each completely surrounded laterally by a boundary trench 15. The boundary trenches 15 extend from the top side 10 into the semiconductor substrate 1 and are filled with an electrically insulating material, such as silicon oxide.

FIG. 4B shows a second position of the method in which the semiconductor substrate 1 is again mounted on a carrier 5 using an adhesive layer 4. A sacrificial layer 3 is formed between the adhesive layer 4 and the electronic circuits 2.

FIG. 4C shows a third position of the method in which the semiconductor substrate 1 is thinned to such an extent that the boundary trenches 15 and the contact regions 14 enclosed by them are exposed. On the bottom side 17 of the thinned semiconductor substrate 1, an electrically conductive material 13 is again applied in the form of a metallic layer. The metallic layer is in electrically conductive contact with the contact regions 14. The contact regions 14 thus form vias through the semiconductor substrate 1, each of which is insulated from the remaining semiconductor material of the semiconductor substrate 1 by the insulating boundary trenches 5. The electronic circuits 2 can be contacted from the bottom side 17 via the electrically conductive material 13 and the contact regions 14. Except in the region of the contact regions 14, the electrically conductive material 13 is electrically insulated from the semiconductor material of the semiconductor substrate 1 by a passivation layer 130.

FIG. 4D shows a fourth position of the method. Optoelectronic devices 8, for example LED chips 8, are applied to the bottom side 17. The optoelectronic devices 8 are each connected to an electronic circuit 2 via the electrically conductive material 13 and the contact region 14. The optoelectronic devices 8 each comprise a semiconductor layer sequence 80 which emits radiation during operation.

FIG. 4E shows a fifth position of the method. Separation trenches 6 are again formed in the region between the electronic circuits 2. Subsequently, the sacrificial layer 3 below the electronic circuit 2 can be removed again with the aid of the separation trenches 6.

FIGS. 5A and 5B show an exemplary embodiment of a semiconductor chip 100 in perspective view. The semiconductor chip 100 can be manufactured using the method described in connection with FIGS. 4A to 4E. In particular, the electronic circuit 2 with the optoelectronic device 8 applied to it was removed from the carrier 5. The semiconductor chip 100 comprises several optoelectronic devices 8 which are arranged on an electronic circuit 2 and are electrically connected to the electronic circuit 2. By detaching the electronic circuit 2 from the carrier 5, the second contact structures 203 of electronic circuit 2 are exposed and can be used for the electrical contacting of semiconductor chip 100.

FIG. 6A shows a first position of a fifth exemplary embodiment of the method. The semiconductor substrate 1 with the electronic circuit 2 applied to it corresponds to that shown in FIG. 1A.

In the second position of the method shown in FIG. 6B, the semiconductor substrate 1 with the electronic circuits 2 in front is mounted on an auxiliary carrier 9. The auxiliary carrier 9 is made of silicon, for example. The semiconductor substrate 1 is temporarily attached to the auxiliary carrier 9 by means of another adhesive layer 90, for example a thermal release layer or a UV release layer or a BCB layer with a laser release sacrificial layer, such as SiNx.

FIG. 6C shows a third position of the method. The semiconductor substrate 1 is thinned to a target thickness. An oxide layer 31 is deposited on the side of the thinned semiconductor substrate 1 facing away from the auxiliary carrier 9. On the oxide layer 31, in turn, a sacrificial layer 3 with holes 30 incorporated therein is formed.

FIG. 6D shows a fourth position of the process. The auxiliary carrier 9 with the electronic circuits 2 on it and the thinned semiconductor substrate 1 is applied to a carrier 5. A sacrificial layer 3 and an adhesive layer 4 with holding elements 40 are again formed between the electronic circuits 2 and the carrier 5.

FIG. 6E shows a fifth position of the method. The auxiliary carrier 9 is detached. The electronic circuits 6 are held by the carrier 5.

In the sixth position of the method shown in FIG. 6F, separation trenches 6 between the electronic circuits 2 are again inserted with the aid of a structured photoresist layer 7.

In the seventh position of the process shown in FIG. 6G, the sacrificial layer 3 below the electronic circuits 2 is removed.

In the method described in connection with FIGS. 1 to 4, the thinned semiconductor substrate 1 is always facing away from the carrier 5. In the method described in FIG. 6, the thinned semiconductor substrate 1 faces the carrier 5. Depending on the method used, the electronic circuits 2 can thus be printed or mounted with the thinned semiconductor substrate 1 first or the wiring layer 202 first.

FIG. 7 shows a position of a seventh exemplary embodiment. This position corresponds, for example, to that in FIG. 6D. Here a dielectric layer 32 is inserted between the sacrificial layer 3 and the adhesive layer 4. The dielectric layer 32 in the present case is simply-connected and comprises, for example, $Al_2O_3$ or $SiO_2$ or $SiN_x$ or consists of one of these materials. The dielectric layer 32 partially fills the holes 30 and separates the holding elements 40 from the semiconductor substrate 1. When the electronic circuits 2 are detached from the holding elements 40, the interface between the dielectric layer 32 and the holding elements 40 preferably tears open. This is more gentle on the electronic circuits 2.

Such a dielectric layer 32 can be used in any of the exemplary embodiments described.

This patent application claims the priority of the German patent application 10 2017 125 276.2, the disclosure content of which is hereby incorporated by reference.

The invention is not limited to the description based on the exemplary embodiments. Rather, the invention comprises every new feature as well as every combination of features, which in particular includes every combination of features in the claims, even if these features or this combination itself is not explicitly stated in the claims or exemplary embodiments.

LIST OF REFERENCE SIGNS 1 semiconductor substrate
2 electronic circuit
3 sacrificial layer
4 adhesive layer
5 carrier
6 separation trench
7 photoresist layer
8 optoelectronic device
9 auxiliary carrier
10 top side
11 isolation trench
12 contact hole
13 electrically conductive material
14 contact region
15 boundary trench
16 separation region
17 bottom side
30 hole in the sacrificial layer 3
31 oxide layer
32 dielectric layer
40 holding elements
70 further adhesive layer
80 semiconductor layer sequence
100 semiconductor chip
130 passivation layer
200 first contact structure
201 transistor
202 wiring layer
203 second contact structure
204 electrically insulating material
205 conductor track

The invention claimed is:

1. A method of manufacturing a plurality of semiconductor chips, comprising:
A) providing a semiconductor substrate with a plurality of integrated electronic circuits on a top side of the semiconductor substrate;
B) applying a sacrificial layer to one side of the semiconductor substrate;
C) introducing holes in the sacrificial layer so that at least one hole is produced above each electronic circuit;
D) adhering the semiconductor substrate, with the sacrificial layer at the front, to a carrier, wherein an adhesive layer is used between the sacrificial layer and the carrier and wherein the adhesive layer fills the holes so that holding elements are formed from the adhesive layer in the holes;
E) thinning the semiconductor substrate;
F) introducing separation trenches between the electronic circuits, which extend from a side of the electronic circuits remote from the carrier to the sacrificial layer and penetrate the thinned semiconductor substrate;
G) removing the sacrificial layer in the region between the electronic circuits and the carrier so that the electronic circuits are held on the carrier via the holding elements.

2. The method according to claim 1, wherein after G) a contact area between the holding elements and an electronic circuit is at least 0.1% and at most 10% of the total area of the electronic circuit facing the carrier.

3. The method according to claim 1,
wherein F) further comprises:
F1) applying a photoresist layer to the side of the electronic circuits remote from the carrier;
F2) structuring of the photoresist layer with trenches, the trenches being formed where the separation trenches are later to be formed;
F3) applying an etching process for producing the separation trenches in the region of the trenches.

4. The method according to claim 1, wherein the carrier is a transparent carrier.

5. The method according to claim 1, wherein an anisotropic, fluorine-based etching process is carried out in F) to produce the separation trenches.

6. The method according to claim 1, wherein
a dry chemical etching process is used to remove the sacrificial layer in G), and
the etchant used for this purpose reaches the sacrificial layer via the separation trenches.

7. The method according to claim 1, wherein
isolation trenches extend between two electronic circuits and/or in the region of the electronic circuits from the top side into the semiconductor substrate,
the isolation trenches are filled with an electrically insulating material, and
in E) the semiconductor substrate is thinned until the isolation trenches are exposed.

8. The method according to claim 7, wherein
an isolation trench is formed between two electronic circuits, and
in F) the separation trenches are formed through the exposed isolation trenches.

9. The method according to claim 7, wherein
between two electronic circuits two isolation trenches are formed which laterally delimit a separation region of the semiconductor substrate, and
in G) the separation trenches are formed through the separation region.

10. The method according to claim 1, wherein
each electronic circuit has a first contact structure arranged above the top side for making electrical contact with the electronic circuit, and
the method further comprises, following E):
E1) introducing contact holes into the thinned semiconductor substrate so that the first contact structures are exposed, and
E2) inserting an electrically conductive material into the contact holes.

11. The method according to claim 1, wherein
each electronic circuit has a first contact structure arranged above the top side for making electrical contact with the electronic circuit,
in the region below the first contact structures, the semiconductor substrate comprises a first contact region in each case, which is laterally surrounded by an electrically insulating boundary trench, in E) the semiconductor substrate is thinned until the boundary trenches and the contact regions are exposed, and the method further comprises, following E):

E3) applying an electrically conductive material to the thinned semiconductor substrate in the contact regions.

12. The method according to claim 10, further comprising, following E):

E4) applying of optoelectronic devices to a bottom side of the thinned semiconductor substrate facing away from the electronic circuits, the optoelectronic devices being electrically conductively connected to the electronic circuits via the electrically conductive material.

13. The method according to claim 1, wherein after A) and before B), the semiconductor substrate with the electronic circuits is first applied to an auxiliary carrier and then E) is carried out, and after D) the auxiliary carrier is removed.

14. The method according to claim 1, wherein each electronic circuit comprises:

a region of the semiconductor substrate and an electronic component formed with said region of the semiconductor substrate, a wiring layer on the semiconductor substrate for contacting the component, and a second contact structure on a side of the wiring layer facing away from the semiconductor substrate, wherein the electronic circuit can be electrically contacted via the second contact structure.

15. The method according to claim 14, wherein the wiring layers of the electronic circuits in A) are connected and form a contiguous wiring layer, the contiguous wiring layer is metallic in the region of the separation trenches to be formed, and in F) the separation trenches are formed through the contiguous wiring layer.

16. The method according to claim 1, wherein after C) a dielectric layer is inserted between the sacrificial layer and the adhesive layer, and the dielectric layer partially fills the holes and separates the holding elements from the semiconductor substrate.

17. The method according to claim 1, further comprising:

H) detaching the electronic circuits from the carrier so that individual semiconductor chips separated from one another are produced.

* * * * *